United States Patent
Hamburgen et al.

(10) Patent No.: US 8,295,047 B1
(45) Date of Patent: Oct. 23, 2012

(54) CHANGING DATA CENTER COOLING MODES

(75) Inventors: William Hamburgen, Palo Alto, CA (US); Jimmy Clidaras, Los Altos, CA (US); Andrew B. Carlson, Atherton, CA (US)

(73) Assignee: Exaflop LLC, Mountain View, CA (US)

( * ) Notice: Subject to any disclaimer, the term of this patent is extended or adjusted under 35 U.S.C. 154(b) by 0 days.

(21) Appl. No.: 12/983,654

(22) Filed: Jan. 3, 2011

Related U.S. Application Data

(63) Continuation of application No. 12/059,569, filed on Mar. 31, 2008, now Pat. No. 7,864,530.

(60) Provisional application No. 60/976,265, filed on Sep. 28, 2007.

(51) Int. Cl.
H05K 7/20 (2006.01)

(52) U.S. Cl. ............... 361/699; 351/679.53; 351/700; 351/701; 165/80.4; 165/110; 165/104.33; 165/185; 62/175; 62/259.2; 62/305

(58) Field of Classification Search .......... 361/679.46–679.53, 688, 689, 361/698–712, 715–727; 165/80.2, 80.4, 165/80.5, 110, 285, 104.25, 104.33, 104.34, 165/104.31, 185; 62/183, 185, 299, 259.2, 62/305, 91, 99, 18, 175, 228.4, 333, 310, 62/335; 700/294–302; 702/182; 29/890.03; 261/112.1, 109, 111, 104, 153, 160, 42, 85, 261/606, 723, 631

See application file for complete search history.

(56) References Cited

U.S. PATENT DOCUMENTS

| | | | | |
|---|---|---|---|---|
| 2,796,743 A * | 6/1957 | McFarlan | ................ | 62/335 |
| 3,024,008 A * | 3/1962 | Blum | ................ | 165/220 |
| 3,850,007 A * | 11/1974 | McFarlan | ................ | 62/305 |
| 4,267,130 A * | 5/1981 | Curtis | ................ | 261/112.1 |
| 4,393,662 A * | 7/1983 | Dirth | ................ | 62/115 |
| 4,495,777 A * | 1/1985 | Babington | ................ | 62/185 |
| 4,696,168 A * | 9/1987 | Woods et al. | ................ | 62/200 |
| 4,924,677 A * | 5/1990 | Quack | ................ | 62/87 |
| 5,040,377 A * | 8/1991 | Braun et al. | ................ | 62/183 |
| 5,348,076 A * | 9/1994 | Asakawa | ................ | 165/282 |
| 5,600,960 A * | 2/1997 | Schwedler et al. | ................ | 62/99 |
| 5,718,628 A * | 2/1998 | Nakazato et al. | ................ | 454/184 |
| 5,946,926 A * | 9/1999 | Hartman | ................ | 62/201 |
| 6,085,532 A * | 7/2000 | Sibik | ................ | 62/179 |
| 6,257,007 B1 * | 7/2001 | Hartman | ................ | 62/183 |
| 6,276,152 B1 * | 8/2001 | Sibik | ................ | 62/201 |
| 6,418,748 B1 * | 7/2002 | Kramer | ................ | 62/434 |
| 6,557,624 B1 * | 5/2003 | Stahl et al. | ................ | 165/53 |
| 6,603,662 B1 * | 8/2003 | Ganrot | ................ | 361/698 |
| 6,640,575 B2 * | 11/2003 | Word | ................ | 62/314 |
| 6,666,042 B1 * | 12/2003 | Cline et al. | ................ | 62/175 |
| 6,848,267 B2 * | 2/2005 | Pierson | ................ | 62/299 |

(Continued)

FOREIGN PATENT DOCUMENTS

JP   402259367 A  * 10/1990

(Continued)

*Primary Examiner* — Michail V Datskovskiy

(74) *Attorney, Agent, or Firm* — Fish & Richardson P.C.

(57) ABSTRACT

A method of providing utilities to a computer data center is discussed. The method includes initially connecting one or more non-evaporative cooling units to a data center as primary cooling plants, obtaining a government-issued water permit, and after obtaining the government-issued water permit, transitioning primary cooling for the data center to one or more evaporative cooling towers.

22 Claims, 10 Drawing Sheets

U.S. PATENT DOCUMENTS

| | | | |
|---|---|---|---|
| 6,938,433 B2 * | 9/2005 | Bash et al. | 62/229 |
| 7,165,412 B1 * | 1/2007 | Bean, Jr. | 62/259.2 |
| 7,278,273 B1 * | 10/2007 | Whitted et al. | 62/259.2 |
| 7,315,448 B1 * | 1/2008 | Bash et al. | 361/701 |
| 7,340,912 B1 * | 3/2008 | Yoho et al. | 62/305 |
| 7,349,213 B2 * | 3/2008 | Campbell et al. | 361/699 |
| 7,373,268 B1 * | 5/2008 | Viredaz et al. | 702/130 |
| 7,406,839 B2 * | 8/2008 | Bean et al. | 62/498 |
| 7,477,514 B2 * | 1/2009 | Campbell et al. | 361/699 |
| 7,484,718 B2 * | 2/2009 | Facius et al. | 261/153 |
| 7,511,959 B2 * | 3/2009 | Belady et al. | 361/701 |
| 7,724,518 B1 * | 5/2010 | Carlson et al. | 361/679.53 |
| 7,738,251 B2 * | 6/2010 | Clidaras et al. | 361/701 |
| 7,788,941 B2 * | 9/2010 | Campbell et al. | 62/259.2 |
| 7,791,882 B2 * | 9/2010 | Chu et al. | 361/698 |
| 7,830,658 B2 * | 11/2010 | Van Andel | 361/679.53 |
| 7,874,171 B2 * | 1/2011 | Park | 62/185 |
| 7,905,105 B2 * | 3/2011 | Fair et al. | 62/259.2 |
| 7,908,881 B2 * | 3/2011 | Kopko | 62/333 |
| 8,004,831 B1 * | 8/2011 | Carlson et al. | 361/679.53 |
| 8,090,476 B2 * | 1/2012 | Dawson et al. | 700/276 |
| 8,094,452 B1 * | 1/2012 | Carlson et al. | 361/699 |
| 2004/0020224 A1 * | 2/2004 | Bash et al. | 62/228.4 |
| 2005/0120737 A1 * | 6/2005 | Borror et al. | 62/434 |
| 2005/0207116 A1 * | 9/2005 | Yatskov et al. | 361/690 |
| 2007/0261421 A1 * | 11/2007 | Pierson | 62/175 |
| 2008/0064317 A1 * | 3/2008 | Yates et al. | 454/118 |
| 2008/0204999 A1 * | 8/2008 | Clidaras et al. | 361/696 |
| 2008/0205003 A1 * | 8/2008 | Belady | 361/700 |
| 2008/0270572 A1 * | 10/2008 | Belady et al. | 709/218 |
| 2010/0149754 A1 * | 6/2010 | Chapel et al. | 361/696 |

FOREIGN PATENT DOCUMENTS

JP    02006300392 A   * 11/1996

* cited by examiner

CHANGING DATA CENTER COOLING MODES

CROSS-REFERENCE TO RELATED APPLICATIONS

This application is a continuation application of, and claims priority to, U.S. application Ser. No. 12/059,569, filed on Mar. 31, 2008, entitled "Changing Data Center Cooling Modes," which claims priority to U.S. Provisional Application Ser. No. 60/976,265, filed on Sep. 28, 2007, entitled "Data Center Utilities," the contents of which are hereby incorporated by reference in their entirety

TECHNICAL FIELD

This specification relates to providing utilities such as electrical power and cooling to a data center.

BACKGROUND

Computer data centers are large commercial buildings that house a very large number of computers, such as thousands or tens of thousands of rack-mounted computer servers and other computing equipment (e.g., storage devices, power supplies, and networking equipment). Generally, computer data centers provide computing services, such as web page hosting, search, e-mail, video, and other services, to a number of distributed remote users.

Because internet-connected users have grown enormously in numbers, and the types of services they demand have grown enormously in complexity, data centers must now provide a quickly increasing amount of computing resources. As a result, the size of data centers has increased, the number of data centers has increased, and because data centers require the use of electronic equipment, the electrical demands of data centers have increased. Because the electricity used by data centers is turned into heat, the cooling demands of data centers have increased significantly also.

SUMMARY

This document discusses various mechanisms and techniques for constructing components of data centers, such as electrical and cooling sub-systems. In certain implementations, the systems and techniques may permit a shorter time period from the start of construction to the time that a significant portion of a data center may begin operating. For example, leased equipment such as chillers and electrical substations or switching equipment may be used initially to start operations with a portion of a data center; permanent, owned equipment may be transitioned in as it is installed and as additional computing capacity is added at the data center. When the permanent equipment is able to handle the load, the leased equipment may be removed and returned.

In another example, air-cooled chillers are installed to provide initial cooling for a portion of a data center before water supply and wastewater permits can be obtained for a facility. The facility can then operate at a limited capacity until the appropriate permits are granted. When such permits are granted, cooling towers that have been installed, such as during the delay of the permitting process, may be brought on-line and may begin using water. The air-cooled chillers may then be removed or may be used to provide supplemental cooling, such as on particular warm days when cooling tower cooling is insufficient, or when certain towers are off-line such as for repair. Similar approaches may be taken using hybrid cooling towers, which may be run in a closed, non-evaporative mode until a sufficient water permit is received, and then may be run in a higher-capacity, open, evaporative mode after a water permit has been received. Such operation techniques can permit a center to begin running much more quickly than would otherwise be possible, particularly when substantial water is needed so that a permitting process would be long and drawn out.

In another example, a cooling system for a data center may be segmented, so that portions of the data center are brought on line, or commissioned, as they are completed in sequence. Each unit of cooling devices in the data center, such as one or more rows of cooling devices associated with rows of computer racks, may be correlated to a particular cooling plant, which may include one or more cooling towers, heat exchangers, and associated circulation pumps. The computing devices may be installed, the cooling units may be erected and connected, and the cooling plants may be added at comparable rates to each other, so that cooling capacity generally expands with computing capacity (and thus with heat generation) during a construction process. Each unit of additional computing power and additional cooling capacity, such as a row or rows of computer racks and a single modular cooling plant, may be brought on-line without substantially interfering with the continued operation of already-commissioned portions of the data center.

The systems and techniques described here may provide one or more advantages. For example, data centers may be brought on-line much more quickly than would be permitted if an organization needed to wait for commissioning of multiple portions of a system or all of a data center. Such techniques may operate within constraints that present themselves in construction-based situations, such as delay times in acquiring and installing large-scale utility equipment such as electrical switching stations, cooling towers, and the like. Rather, by operating with smaller-scale equipment or limited-capacity equipment during the construction process, including equipment that may be leased rather than owned, problems created by acquisition of and commissioning of large-scale equipment can be avoided or at least prevented from directly affecting the operation of the data center. Rather, a data center may be brought on-line in a much more piece-meal fashion that permits the computing workload to be started early in the process.

In one implementation, a method of providing utilities to a computer data center is disclosed. The method includes providing one or more cooling fluid conduits having a plurality of segments that can be isolated from other segments, connecting a first group of computer cooling units and a first cooling plant to the conduit and commissioning the first group of computer cooling units and the first cooling plant, and sequentially commissioning additional groups of computer cooling units and cooling plants. The additional groups of cooling units may be commissioned without substantially interrupting operation of the first group of computer cooling units. Also, commissioning the additional groups of computer cooling units can comprise connecting the additional groups of computer cooling units to segments of the one or more cooling fluid conduits.

In one aspect, the cooling plants are modular units each including one or more cooling towers and associated heat exchangers. Also, each of the one or more fluid conduits can define a substantially constant cross-section along a substantial portion of its length. In addition, the first cooling plant can comprise a rented cooling plant and the additional cooling plants comprise purchased cooling plants. Also, the sequential commissioning can occur substantially to maintain n groups of computer cooling units generally matched in load to a cooling plant, and n+1 or more cooling plants, so as to provide back-up cooling capacity.

In another implementation, a data center cooling system comprises cooling fluid supply and return conduits having a plurality of segments that can be isolated from other segments of the fluid supply and return conduits, a first group of computer cooling units inside a data center and a first cooling plant in operational fluidic connection through the supply and return conduits, and a second group of computer cooling units inside the data center and a second cooling plant in physical connection with the supply and return conduits but not in fluidic connection with the first group of cooling units and the first cooling plant. The supply and return conduits can be provided with a plurality of taps, wherein each pair of taps corresponds to a group of computer cooling units to be attached to the system. Also, each of the supply and return conduits can define a substantially constant cross-section along a substantial portion of their lengths.

In some aspects, the first cooling plant comprises a rented cooling plant and the additional cooling plants comprise purchased cooling plants. Moreover, the system can further comprise a plurality of groups of computer cooling units, wherein each group is connected to a distinct cooling loop, wherein more than one of the plurality of groups of computer cooling units has been commissioned and one or more of the plurality of groups of computer cooling units has not been commissioned.

In yet another implementation, a method of providing utilities to a computer data center is disclosed. The method comprises leasing one or more cooling plants for providing utilities to the data center, operating a portion of a data center during construction of the data center using the leased cooling plants, and transitioning from the leased cooling plants to owned cooling plants during construction of the data center. The units may be selected from a group consisting of electrical substations, cooling towers, and chillers.

In another implementation, a method of providing utilities to a computer data center is disclosed. The method can include initially connecting one or more air-cooled chillers to a data center as primary cooling plants, obtaining a government-issued permit, and after obtaining the government-issued permit, transitioning primary cooling for the data center to one or more cooling towers. The method can also include, after transitioning primary cooling for the data center to one or more cooling towers, operating the air-cooled chillers to provide supplemental cooling. In addition, pre-water operation may occur using a closed portion of a hybrid cooling tower or other similar system, with the open portion of the cooling tower being used (with evaporative cooling added) after a permit is obtained, so that make-up water may be accessed. In addition, the method can include, after transitioning primary cooling for the data center to one or more cooling towers, disconnecting one or more of the one or more air-cooled chillers from the data center. In some aspects, the one or more disconnected air-cooled chillers comprise leased equipment.

The details of one or more implementations of the data center construction systems and techniques are set forth in the accompanying drawings and the description below. Other features and advantages of the systems and techniques will be apparent from the description and drawings, and from the claims.

DESCRIPTION OF DRAWINGS

Like reference symbols in the various drawings indicate like elements.

DETAILED DESCRIPTION

In general, various example techniques are described here for constructing and operating data centers in manners that can permit accelerated operation of the data centers, so that the centers may begin serving customers more quickly than would otherwise be possible. The techniques generally involve establishing a cooling plant to handle a portion of a complete data center load, and commissioning that portion of the data center while construction continues on other portions of the data center. The cooling plant may, in certain examples, include (1) leased equipment that is returned to a leasing company after other cooling plants are completed to supply other portions of the data center; (2) lower capacity equipment such as air cooled chillers or hybrid cooling towers that can be leased or can be on-site for supplemental cooling after a full data center is operational; or (3) modular cooling plants that may be brought online sequentially as they are completed during a construction process, without substantially interfering with ongoing operation of the data center. In addition, various arrangements discussed here may provide greater flexibility in ongoing operation of cooling systems in data centers.

Figure 1A:
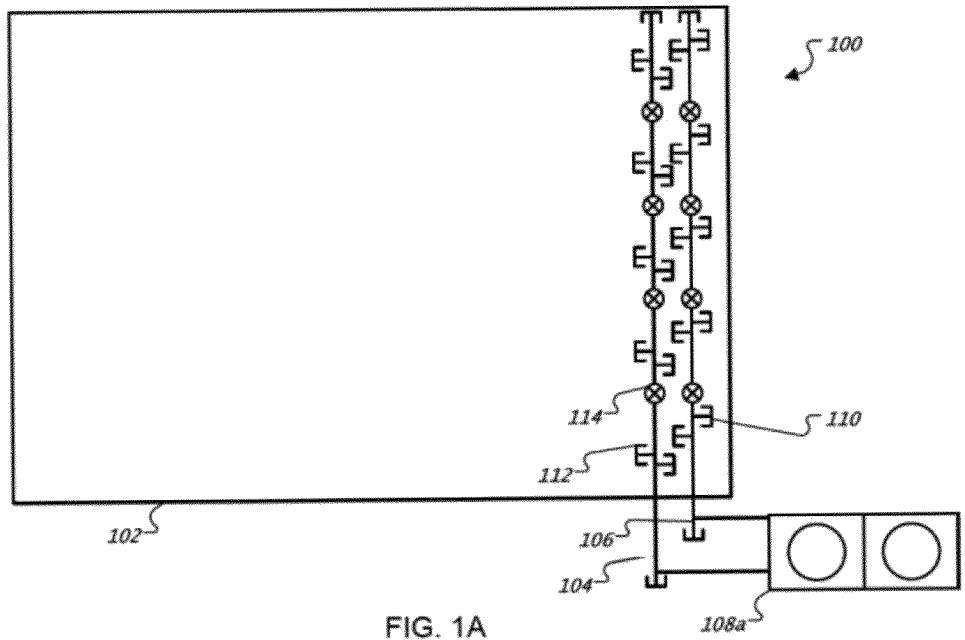
FIG. 1A is a plan view of a data center during early construction.

FIG. 1A is a plan view of a data center 100 during early construction. The data center 100 is generally made up of a computing facility 102 that may house thousands or tens of thousands of computing systems. Generally, computational demands are made on the data center 100 by remote users distributed throughout a geography, such as by search requests, requests to access e-mail applications, or request to access other applications such as mapping, shopping, and other such services. The data center 100 may be operated, for example, by a company such as GOOGLE or that provides numerous computing services to the public, or by a company that provides more limited services such as e-commerce related services, or alternatively by a company that provides simply access to various applications in a server-based model (such as by a software-as-a-service distribution model).

The computing facility 102 is served in this example with a utility in the form of cooling water, by a cooling plant 108a. The cooling water may generally be circulated to cooling units located throughout the facility 102, that include water-to-air heat exchangers for cooling air in the facility 102 that has been heated by computers in the facility at 102. Depending on the particular application, cooling fluid such as in the form of cooling water may be supplied at a first low temperature and returned to the cooling plant 108a at a second higher temperature. The supplied temperature for the cooling fluid may be in the range, for example, of 40-70° F. or 40-90° F., and the return cooling fluid temperature may be in the range of 50-100° F. or 50-130° F., as examples.

As described in more detail below, the cooling plant 108a may provide cooling to the cooling fluid in a variety of manners. In a relatively efficient manner, cooling may be provided by cooling towers that remove energy from a system by water evaporation, so that water returned by the cooling towers is significantly cooler than water supplied to the cooling towers. In general, cooling towers systems are open systems so that the water in such a system may become contaminated and otherwise unfit for use in clean piping systems. As a result, cooling plant 108a may also be provided with a water-to-water heat exchanger or multiple heat exchangers that transfer heat from water returned from facility 102, to water from cooling towers.

Various parameters for the data center 100, such as operating air temperatures (supply and exhaust) around the computing components, water temperatures, and air and water flow rates, may be selected according to various acceptable design goals. Such parameters may be selected so that cooling using cooling towers may provide all or substantially all of the cooling that is necessary for facility 102. The parameters may be enforced by a typical digital electronic control system (e.g., digital electronic control system 211).

Supplemental cooling may also be provided, such as by cooling plant 108a, including by providing commercial chillers with cooling plant 108a that add to the cooling provided only by the cooling towers, as discussed in more detail below. The chillers may take a variety of forms, such as reciprocal chillers, air-cooled chillers, adsorption chillers, and other appropriate forms. Because chillers generally take appreciably more energy to operate than do simple evaporative cooling systems such as cooling towers, operation of the chillers may be avoided where possible. As a result, supplemental cooling systems such as chillers may be reserved for operation on very warm days or at other times when the load in facility 102 exceeds the ability to cool the facility sufficiently with mere evaporative cooling. For example, such a load may exceed the available cooling capacity when one or more cooling plants are removed from operation, such as for maintenance.

Cooling plant 108a is shown connected to supply header 104 and return header 106. The headers 104, 106 may take the form of large conduits such as steel pipes or other common and appropriate conduits for carrying cooling fluid. The headers 104, 106 are shown for clarity here as extending beyond one side of facility 102. A particular location and routing of the headers 104, 106 may also take various other forms according to the plan of facility 102 and the needs of the particular installation.

The headers 104, 106 are shown as being provided with a number of taps such as tap 110 and tap 112. The taps may take an appropriate form for providing fluid communication between the headers 104, 106 and either cooling units in facility 102 or cooling plants outside of facility 102. In particular, headers 104, 106 may be initially configured so as to permit the connection of multiple rows of cooling units and multiple cooling plants to the headers once those additional cooling units and cooling plants have been installed and are operational.

In addition, various isolation valves, such as valve 114, are shown on headers 104, 106. The valves may be used to segment portions of the headers 104, 106 so that portions on which construction is still occurring may be kept dry and not in fluid communication with the rest of the system. Alternatively, valves such as shutoff valves or balancing valves that can also act as shut-off isolation valves, may be installed on the taps, such as tap 110 and tap 112, to provide fluid-related segmentation of the system. Such valves may permit uncapping of the taps to connect additional components of the system, without providing fluid communication to the operational portions of the system (with subsequent opening of the valves to provide fluid communication when all components have been installed, sealed, and tested).

Figure 1B:
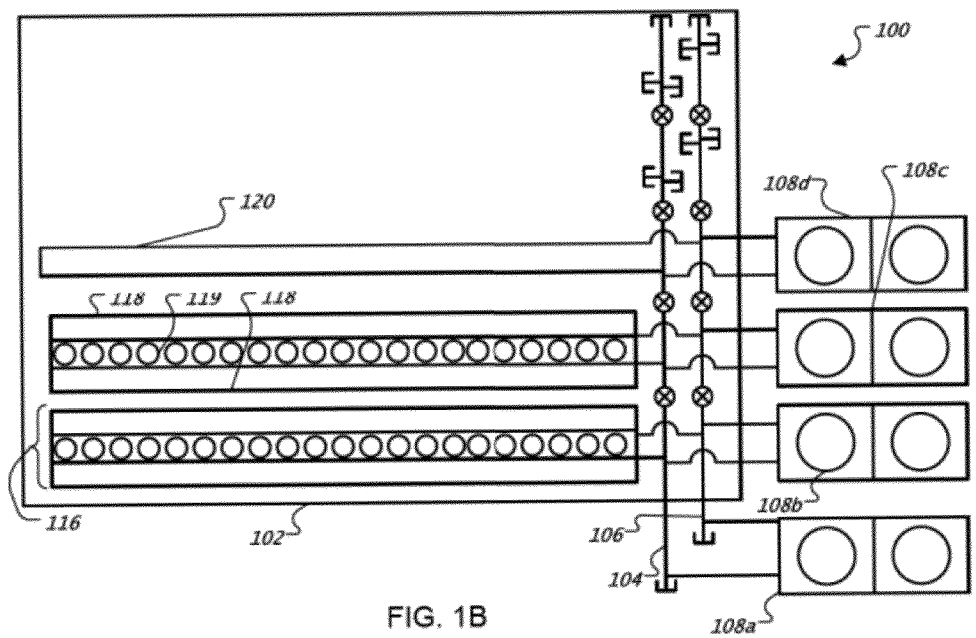
FIG. 1B is a plan view of the data center of FIG. 1A at a later stage of construction.

FIG. 1B is a plan view of the data center of FIG. 1A at a later stage of construction. In this example, the data center 100 has been under construction for a period of time after that shown in FIG. 1A. In particular, groups of computers in the form of rows such as a row 116, have been installed inside facility 102. In this example, the data center computers are installed as back-to-back rows 118 of rack-mounted computers, where the computers back up to cooling units 119. The rack-mounted computers may, for example, take the form of a number of computer motherboards, and possible carriers for supporting the motherboards, mounted vertically across a rack (e.g., in the form of a so-called blade server) or horizontally up and down a rack much like bread trays may be mounted in a bakers rack, or lunch trays in a rack. The fronts of the racks may be left open to the workspace inside facility 102 and the backs of the racks may be left open to cooling units 119 or may otherwise exhaust air out to cooling units 119 (e.g., through fans mounted to each motherboard or otherwise associated with each motherboard or group of motherboards).

In operation, then, circulating air may enter the fronts of the racks from the workspace, may pass across heated components in the racks, such as microprocessors and memory chips, and may be exhausted out of the back of the racks into the cooling units 119, so that each cooling unit receives heated exhaust air from racks on opposed sides. The cooling units 119 may be provided with air circulating equipment such as fans and cooling equipment such as cooling coils, so that air is drawn through the coils and exhausted in a cooled state back into the data center workspace.

In one example, the cooling units are placed between the back edges of the computer racks, and exhaust cool air upward into an upper region of the workspace. In another implementation, air may enter a warm air plenum behind the computers and be drawn down into an under-floor space (e.g., below a real or false floor), where it may be gathered, circulated through cooling coils, and delivered back into the workspace, such as through perforated floor plates.

The cool air may then be circulated again to the front side of each rack and pulled back across the racks and into the cooling unit 119 again. Various other arrangements of computing machinery, and air circulating and cooling equipment, may also be used.

The cooling units 119 may be individual units that are configured in a row and brought into close contact with the computing racks. In this example, two rows of computers have been installed in the facility 102, where each row contains two rows of computing racks sandwiched on each side of corresponding cooling units. In one example, each rack may be approximately five feet wide (having three bays of computers per rack), and six to eight feet, or 14 or more feet high.

In certain implementations, temporary filtration may be provided with the racks. For example, if certain racks are installed and/or run during construction, they may be subjected to dust, and filtration of the dust may be preferable. In such a situation, large relatively flat sheets of filtration material may be formed and held against the fronts of the racks. For example, sheets of foam may be cut to approximate the height of the racks (or at least of the air intake areas on the racks) and may be pressed up against the racks to provide simple, low cost filtrations. Other filter media may be used in a similar manner, such as various forms of sheets of material.

Such filters may be held in place in a variety of manners. For example, differences in air pressure may be enough to provide some connection between the filters ad the fronts of the racks, such as to hold the bottoms of the filters against the racks if the tops of the filters are connected. Greater strength of connection may be achieved with simple clamps, adhesives, magnets attached to the filter media or a filter frame around the media, and other similar mechanisms. When construction is complete or a need for the filtration otherwise ceases, the filtration media may be removed and cleaned for re-use, or disposed of. Such configurations are discussed in more detail with respect to FIGS. 7A and 7B.

A cooling loop 120, in the form of additional piping, has also been installed and connected to headers 104, 106 in preparation for installing computing racks above the loop. Although vertical positioning is not discernible in this figure, the cooling loop 120 may be located below the level of the computer racks, as may cooling loops for the particular computing racks that are shown here, where those additional cooling loops are not visible in the figure. For example, the cooling loops may be located below a raised floor in a facility, or may be located in a ceiling space of a level that is below the level where the computing racks are located. Similarly, the cooling loop may be located above the computer units, though such location may raise issues with respect to leaking water impinging on the computer racks. Cooling loop 120 may also be located within or adjacent to cooling units 119.

Also in the figure, additional cooling plants 108b-d have also been installed with the data center 100. In the example, each cooling plant 108b-d is associated with a particular row of computer racks within facility 102. Such a correlation may be based on prior calculations indicating that a cooling load for a row of racks is substantially equivalent to the cooling that may be supplied by a particular cooling plant 108b-d. In a similar manner, if a cooling plant is able to cool substantially more than one row of computer racks, each cooling plant may be associated with 2, 3, or more rows of computing racks. Also, an uneven number of cooling plants to computer racks may be used, such as 1.5 cooling plants for two rows of computer racks, or one cooling plant may cover a fraction of a row.

Each of the cooling plants 108a-d is provided in a modular or substantially modular format. In particular, each cooling plant 108 may contain within it each of the components or major components needed for a cooling plant, such as cooling towers, heat exchangers, valving systems, and pumps for cooling fluid. The fluid may take a variety of forms, including water, treated water, glycol mixtures, and other fluids. In a like manner, each row or group of rows of computing racks may also be modular, in that it does not share a cooling loop with other rows or group of rows of computer racks. Control for the various components may be centralized, however, in various well-known manners.

Thermal storage systems, such as brine tanks or water tanks, may also be used so as to store cooling capacity during periods of lower cooling demand, and to release that capacity during high load periods, so as to supplement the core real-time cooling capacity of a system (e.g., from cooling towers).

In this example, four cooling plants have been erected, and two rows of cooling units and computer racks have been installed, with a third row ready to be installed. The next stage in construction may be to install additional rows of cooling units and computer racks above cooling loop 120 and to provide piping connections between cooling units for those new computer racks and the loop 120. After that, another cooling plant and another corresponding row of cooling units and computer racks may be installed. The process of adding cooling plants and rows of cooling units and computer racks may continue until the facility is filled.

As shown, by using cooling plant 108a that does not correspond to any particular load in facility 102, the data center 100 may always have one additional cooling plant compared to its nominal needs. This additional plant provides additional capacity that permits the data center to operate at full capacity (at least for the full capacity of the portion of the data center 100 that has been completed and commissioned) even if one cooling plant breaks or needs to be brought down for maintenance. The additional plant also allows for additional capacity during high load periods when all the cooling plants are operational. In other words, where the load is n, the supply may be maintained under normal conditions and during construction at n+1 (or n plus another appropriate number). The additional cooling plants may be desirable to improved reliability.

The headers 104, 106 may be sized so as to permit sufficient flow of cooling fluid from one end of the headers 104, 106 to the other even when one or more cooling plants are not operational. For instance, although in full operation, cooling fluid could flow readily from one cooling plant across to its associated group of cooling units in the facility 102 so that the headers 104, 106 would need to carry very little fluid up-and-down in the figure, the headers 104, 106 may be sized to allow flow of cooling fluid from one segment to the next (e.g., up-and-down in the figure), such that if the top-most (in plan view) cooling plant fails, sufficient cooling fluid may be transferred upward through the headers 104, 106 from the other cooling plants so as to continue full operation of the top-most group of cooling units.

Figure 1C:
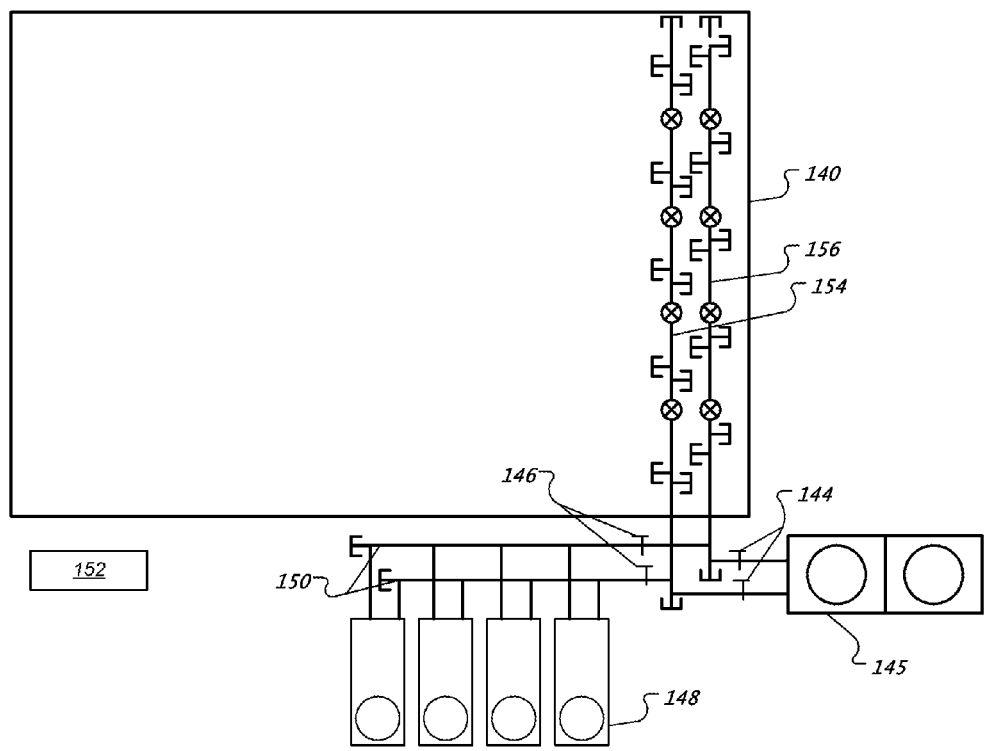
FIG. 1C is a plan view of a data center during early construction that is using leased cooling plant equipment.

FIG. 1C is a plan view of a data center during early construction that is using leased cooling plant equipment 148. In general, the organization of the data center is similar to that of the example data center 100 shown in FIG. 1A, but with the addition of the leased equipment 148.

In particular, in this example the facility 140 is again organized to be served by a number of cooling plants that will be installed and made operational while other portions of the facility 104 have already been commissioned, and stay in operation or continue operation with minor interruptions due to commissioning of additional portions of facility 140. In the figure, one permanent cooling plant 145 has been connected to a cooling fluid circulation system, such as in the form of a supply header 154 and a return header 156. Isolation shutoff valves 144 enabled the cooling plant 145 to be fluidically disconnected from the rest of the circulation system, such as when maintenance or replacement of cooling plant 145 is necessary.

In a like manner, leased equipment 148 is also connected to the fluid circulation system and provides additional cooling capacity to the system. The leased equipment 148 may be connected via headers 150 and may be isolated from the system by shutoff valves 146. The leased equipment 148 may generally be smaller in size and capacity than the cooling plant 145, though larger equipment may also be in used in appropriate circumstances. For example, the leased equipment 148 may be sized to be mounted and transported on a standard trailer from a tractor-trailer combo. The leased equipment 148 may thus be quickly connected by flexible fittings and the like, and may be easily disconnected and returned to a leasing company.

In one example process for initiating the operation of the data center, the main circulation system and the headers 150 may initially be installed. The leased equipment 148 may then be procured and attached to the headers 150. Computing equipment may be installed inside the facility 140, and may be commissioned to operate using cooling provided by the leased equipment 148. For example, a single group of computer cooling units associated with a group of computer racks may be brought online and operated to provide partial operation of the facility 140.

While the limited operation is occurring, cooling plant 145 may be erected while shut-off valves 144 remain closed. When the cooling plant 145 is complete and tested, shutoff valves 144 may be opened and the cooling plant 145 may be fluidically connected to the rest of the system and brought on line, or commissioned. As the operation of the facility 140 continues, additional computer cooling units and computer racks and computer cooling units may be installed and additional cooling plants may be added and connected to the fluid circulation system. Those additional loads and cooling plants may be sequentially commissioned so that the cooling fluid that is supplied generally matches the cooling load in a stepwise parallel manner, and as much of the facility as is practicable may be brought online, or commissioned, immediately.

In some approaches, the cooling piping used by the temporary equipment may be removed when such equipment is removed, such as after one or more permanent cooling systems is commissioned. Alternatively, the cooling piping may be left in place so that temporary equipment may be brought back on site and used whenever additional capacity is needed such as during a particular warm spell or high demand period for computing services, or during maintenance or unexpected break downs in the permanent equipment.

In addition to cooling equipment, electrical equipment may also be used on a temporary basis, while construction is occurring, for permanent electrical equipment. For example, electrical substation 152 may be provided in proximity to facility 140 and may provide a limited electrical service to the facility 140. For example, in a facility designed to have 20 groups of computers, a leased substation designed to support 5% of the ultimate load may be provided on-site and may power a first group of computers. In addition, a substation or other electrical equipment may be provided to power leased equipment 148 and other ancillary equipment for the facility 140, until sufficient permanent power supply sources have been installed and commissioned.

The event of commissioning generally relates to a time when a system or subsystem is brought into full operation. Generally, such commissioning requires a review of a built system and an approval to begin full operation of the system. For example, commissioning may require approval under a particular organization's guidelines for approving operation of data centers. The organization may be the owner of the data center itself, may be a third-party private organization (such as a rating organization), or may be a governmental organization such as a local or regional building department. Generally, commissioning of a data center means that the commissioned components are able to provide services to a large portion of the intended end users of a system, such as to the public for an on line service provider. Pre-commissioning activities may, in contrast, include testing of the computing components, testing of the cooling system components, and other similar testing or less-then-commercial activities.

Figure 2:
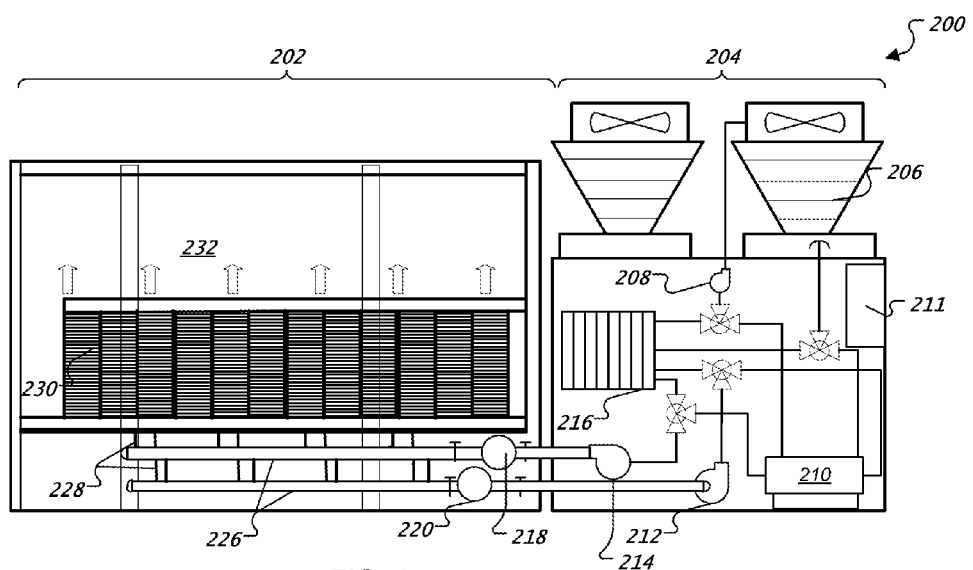
FIG. 2 is a side sectional of a data center.

FIG. 2 is a side sectional of a data center 200. In general, the data center 200 has a similar layout to the data center 100 shown in FIGS. 1A and 2A. For example, the data center 200 generally includes a data center facility 202 in which computing resources are located, and one or more associated cooling plants like plant 204 that provide cooling fluid to the data center facility 202. The particular arrangement of the data center facility 202 and cooling plant 204 may differ, and in this example, as in the other figures, the cooling plant 204 is being shown as a largely self-contained, modular cooling plant that is associated with one or more rows of computer racks 230.

Referring to components inside data center facility 202, computer racks 230 are located on top of a floor, which may be a standard or raised floor, having a walking space or crawlspace below. For example, the below-floor space may be an area from about 1 foot in height to about 8 feet or more in height. The below-floor area includes a supply fluid header 218 and a return fluid header 220. In this example, the supply fluid header 218 receives cooled water from cooling plant 204 and other similar cooling plants, while the return fluid header 220 receives warmed water back from the racks 230 and provides the warm water back to the cooling plants, such as cooling plant 204. The facility 202 need not have a raised floor, however and could be deployed on slab, with mechanical utilities above or below the slab.

Spurs 226 are provided off of each of the supply fluid header 218 and the return fluid header 220, and extend linearly into the facility 202 past (e.g., under, behind, or over) the computer racks 230. At particular locations, such as locations corresponding to individual cooling units associated with the racks 230, risers 228 extend upward and connect to the cooling units. In this example, the cooling units are not shown because they are located behind the racks 230 from the illustrated viewing angle. In general, the cooling units may include standard cooling coils, along with air circulation fans that may assist in drawing air across computing components, perhaps in combination with fans located on particular computer motherboards or with particular computer motherboards, and cooling the air before re-circulating it into workspace 232 inside facility 202.

Cooling plant 204 contains a number of pieces of equipment needed to receive, cool, and circulate fluid for facility 202. Primary cooling occurs by cooling towers 206, which may take a variety of forms, such as upward flow open evaporative cooling towers. To prevent cooling tower water from entering facility 202, such water, which may be driven by pump 208 and other pumps that are not shown, may be routed through fluid-to-fluid heat exchanger 216. The exchanger 216 may take a variety of forms, such as one or more plate heat exchangers or shell-in-tube heat exchangers. Cooling water for facility 202 may be circulated through the other side of heat exchanger 216 by supply pump 214 and/or return pump 212. The particular number of and form of pumps and valves may take various forms, and is shown here simply to illustrate possible manners in which to pipe such a cooling system.

Supplemental cooling may be provided by chiller 210, which may be in the form of an air-cooled chiller as discussed above and below, that may be operated before cooling towers 206 are operational or before a water permit has been received. Generally, chiller 210 will be smaller in capacity than are the cooling towers 206.

As thus described, data center 200 may operate in a manner that matches portions of the cooling load, such as by having rows of computer racks and associated cooling units, to particular cooling plants. In this manner, each unit of cooling load may be brought on-line as a corresponding unit of cooling supply is made ready. The matching of cooling load to cooling supply may be made less direct using cooling fluid mixing devices such as headers 218, 220, so that, although load is matched with supply in a stepwise manner (when X BTUH's of load are added, approximately X BTUH's of cooling may be added), particular increases in load or supply may be taken up by supply from different cooling plants across the system. In particular, a system may be provided with greater diversity by allowing cooling water from one plant to be mixed with cooling water from an adjacent plant or another plant, such as by using common headers that permit lateral cooling fluid flow between modules.

Figure 3:
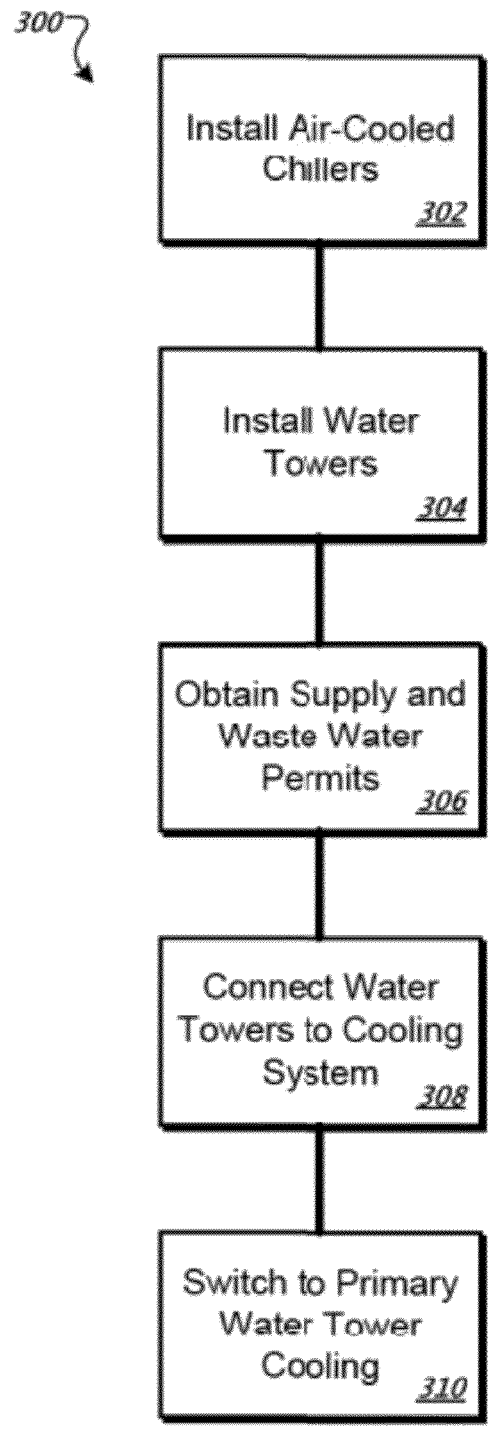
FIG. 3 is a flowchart showing a process for staged start up of a data center facility.

FIG. 3 is a flowchart showing a process 300 for staged start up of a data center facility. In general, the process shows one example of a technique for beginning operation of a data center using cooling equipment, and transitioning to higher capacity cooling equipment. In certain circumstances, the lower capacity cooling equipment may be maintained on site and made available for ready use, such as when supplemental cooling is needed (e.g., on particular warm days or when main cooling units must be removed from service). Generally, the temporary cooling equipment will have a higher cost of operation than will the higher capacity cooling equipment.

At box 302, air-cooled chillers are installed at a site. The air-cooled chillers may be sized to provide a portion of the cooling that will ultimately be needed for a data center at the site. Some portions of the entire data center may be operated and be cooled by such air-cooled chillers.

Alternatively, or in addition, hybrid cooling towers (which may also be termed building heat exchangers) may also be installed. Such towers may be operated in a non-evaporative mode, where make-up water would not be needed, and in an open, evaporative mode, where make-up water would be needed. The evaporative mode typically has much higher capacity and allows supply of acceptably cool fluid at higher outdoor dry-bulb temperatures than does the non-evaporative mode, but uses substantially more water. Additional capacity with some increase in water usage may be obtained by misting water on the water conduits in the non-evaporative mode so that the conduits are cooled and more heat can be drawn out of the circulating water.

With such hybrid towers, the system may be operated initially (before relevant permitting or other go-ahead measures are obtained or performed) in a non-evaporative mode, and then in an evaporative mode when sufficient levels of make-up water may be obtained. In the initial phase, only a portion of a data center might be supported, which may be acceptable if only a portion of the data center has been constructed and installed. Additional loads may be installed in the data center while an organization is waiting for a water permit or other appropriate permitting, so that the loads (e.g., racks of computers) are ready to come on-line when the higher capacity mode for the towers is ready to come on line.

Also, in certain circumstances, provisions may be made to dispose of waste "blow down" water and other such water. For example, waste water treatment facilities may be built or brought on site, such as in transportable modules, to provide such treatment capabilities, at least until a waste water permit can be obtained.

At box 304, cooling towers may be installed at the site. The cooling towers may be included as part of a modular unit with the air-cooled chillers, such as described above with respect to FIG. 2. For example, a frame may be erected or may be brought to the site such as on a semi-trailer, where the air-cooled chiller and associated pumps and heat exchangers are provided in the frame. The frame may be constructed so as to hold one or more cooling towers on its top edge, and the towers may be installed after the equipment inside the frame is fully operational (because towers may generally be too tall for transport if stacked on top of the frames during shipment). The cooling towers may also be connected physically to the water circulation system but may be kept disconnected fluidically, or may be kept closed in a non-evaporative mode, until approval is received to operate the towers.

At box 306, water supply and wastewater permits are obtained. With the permit, the facility may now draw in make-up water from, for example, a city or regional water system or a well, to replace water that evaporates in the towers. Such a permit may allow the facility to operate at a much larger capacity, as the cooling towers may operate much more efficiently than may a chiller, and may thus be sized to handle a much larger load than would be economical with the chiller. Other appropriate triggering mechanisms for starting the operation of the cooling towers may also be used, such as a building inspector approval or other similar approvals.

At box 308, the cooling towers are connected fluidically to the cooling system, or are opened for evaporative cooling. The towers may have previously been connected physically to the system, but shut-off valves may have remained closed until the towers could provide water to the system. Upon adding the cooling towers to the system, the chiller may be powered down and taken off-line, and the cooling system switched primarily to cooling tower cooling, as shown at box 310. At later times, the chiller may be added back into the system, such as on particularly warm days or when heat loads in the facility are very high or water is not available for the cooling towers.

Figure 4:
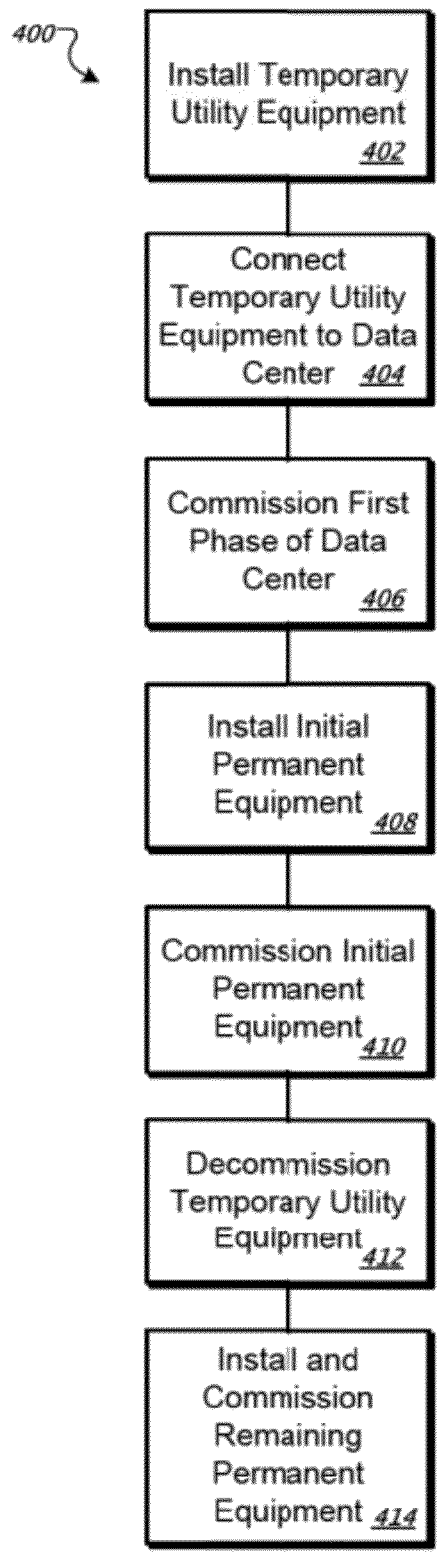
FIG. 4 is a flowchart of a process for transitioning a data center from temporary to permanent utility equipment.

FIG. 4 is a flowchart of a process 400 for transitioning a data center from temporary to permanent utility equipment. In general, the process 400 involves leasing cooling equipment that can handle a portion of the load of a full facility, using the leased cooling equipment to get the facility operational quickly, building permanent equipment while the facility is run at a reduced level, and transitioning to the permanent equipment and raising the capacity of the facility when the permanent equipment is ready. Such transitioning may occur in a single step, such as bringing on the permanent equipment at one time, or may occur sequentially in a number of steps, such as by providing a number of discrete cooling plants for the facility and bringing them on-line singularly or in smaller subgroups.

At box 402, cooling equipment for the facility is leased. Leasing the equipment may permit a facility to acquire equipment more quickly than purchasing and installing equipment. However, leased equipment is generally smaller and of lower capacity than would be permanent equipment. For instance, leased equipment may be of a size that may be transported easily on semi-trailer trucks or by other similar mechanisms. Thus, in this example, the leased equipment is not capable of serving the entirety or a substantial entirety of the facility. Rather, the leased equipment is used to provide quick up time for a portion of the facility—in this example, a data center.

At box 404, the leased cooling equipment is connected to the data center. In one example, a common circulation loop, such as in the form of a supply header and return header, may be provided for a facility, where the loop may be segmented by shutoff valves located in the loop or in taps off of the loop, so that connections may be made to the loop with new equipment while existing equipment is still operating in the loop.

At box 406, a first phase of the data center is commissioned. For example, an initial group of computers and associated computer cooling units inside the facility may be installed and made operational, as may a group of leased cooling plants for serving such units. In this step, the cooling units and computing units and the associated leased equipment may be commissioned and brought online.

At box 408, initial purchased equipment is installed. For example, a first permanent cooling plant may be added to the facility and connected to the cooling system. The connection may be physical but not fluidic initially, in that all necessary piping may be connected, but shutoff valves may isolate the new equipment from the rest of the system.

At box 410, the initial purchased equipment is commissioned such that it is fluidically connected to the cooling system. If the initial purchased equipment is sufficient to provide cooling for the currently operational portions of the facility, some or all of the leased equipment may be decommissioned and removed, as shown at box 412. For example, the leased equipment may be shut down, isolated fluidically from the rest of the system using shutoff valves, and returned to a leasing company.

At box 414, the remaining purchased equipment for a facility may be installed and commissioned. For example, the initial purchased equipment may be sufficient to supply the then-existing portion of a facility, but insufficient to supply all of the cooling loads that ultimately may be installed in the facility. As a result, after the leased equipment is removed, construction may continue to add computer cooling units and computers, and corresponding construction may continue to add cooling plants for the facility. Each cooling plant may be largely self-contained and connected to a common circulation loop using taps and shutoff valves as described above.

A particular number of cooling plants and groups of computers may vary with each application, and may be brought online, or commissioned, in various manners. In one example, the commissioning may be sequential from one end of a facility to another end of the facility, with cooling loads and cooling plants being located one after the other adjacent to each other in a line. Such an arrangement is shown, for example, in FIG. 1B.

Figure 5:
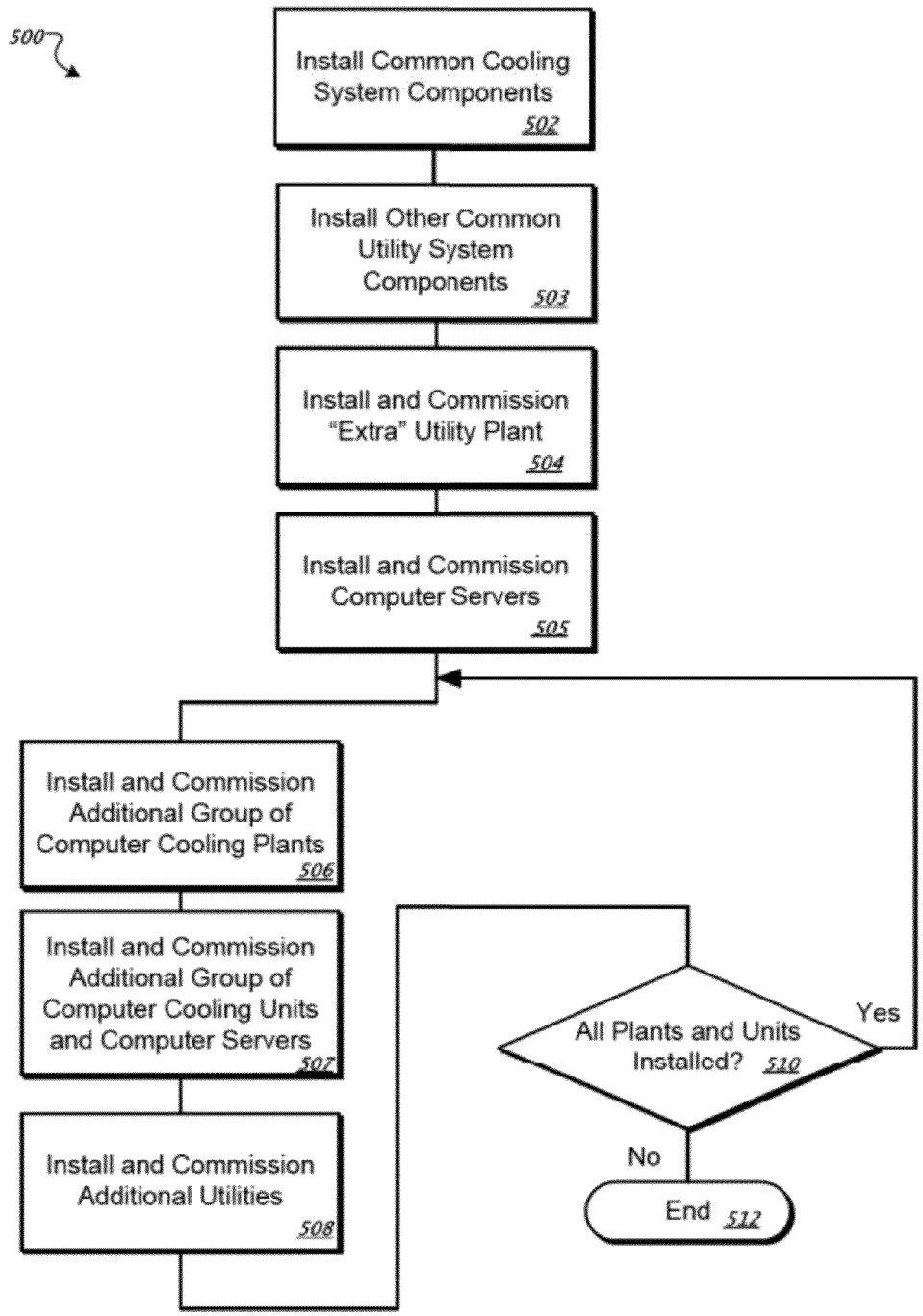
FIG. 5 is a flowchart of a process for sequential commissioning of parts of a data center system.

FIG. 5 is a flowchart of a process for sequential commissioning of parts of a data center system. In general, the process 500 shows the construction of a data center with a cooling system in a sequential manner so that an initial portion of the system may come on-line followed by additional portions of the system. In this example, one extra cooling plant is commissioned in advance to provide additional cooling in the event that such cooling is needed or that another cooling plant is removed from service.

At box 502, common cooling system components that connect multiple portions of the system are installed. For example, headers in the form of conduits that serve an entire facility can be installed and can be segmented so that separate groups of cooling units can be connected individually to the common components. The segmentation may occur, for example, by providing valves in the headers themselves, or in taps off of the headers that serve groups of cooling units. All of the common components may be installed initially, or portions may be installed. For example, headers may be installed to serve half a facility, with shut-off valves in taps and a single shut-off valve in each header near the header ends. The headers may then be extended after the first half of the project is completed, by adding conduits to the ends of the headers and opening the shut-off valves.

At box 503, common utility system components are installed. Such components are similar to the common cooling system components, and could be thought of as a single group of components. In this example, however, the utility system components are upstream of the cooling system components and provide utilities to such components. For example, water supply piping to a site and main electrical service infrastructure may be though of as common utility system components. Such components that are needed to serve an entire facility or large portions of the facility, may be installed and commissioned initially so as to minimize disruptions to utility services as modular portions of a facility are added sequentially to the system.

At box 504, an "extra" cooling plant or plants is installed and commissioned. This "extra" plant may not be associated with any particular group of cooling units, and may simply serve to provide back-up or additional reserve cooling capacity in case it is needed. The presence of a single cooling plant that is matched to the cooling load may be sufficient to commission that portion of the facility (and such portion may be commissioned), or it may be insufficient (in which case, commissioning will need to wait). In other words, where the demand is for n plants, the construction may be phased so that n+1 plants are always available. With the cooling capacity ready, the extra servers or other cooling loads may be commissioned once they have been installed (box 505). (Installation of the servers can begin before the extra cooling capacity is ready.)

At box 506, an iterative process of expanding the facility capacity is begun. In particular, an additional cooling plant or cooling plants are installed and commissioned. Likewise, at box 508, additional groups of computer cooling units (along with associated computer racks containing operating computers and other computer equipment like storage and networking devices) are installed and commissioned. Such cooling plants and groups of cooling units may be arranged in a manner like that shown in FIG. 1B so that there is a 1-to-1 or x-to-1 relationship between groups of cooling units (e.g., in linear rows) and cooling plants. Also, particular cooling plants and associated cooling loads may be added to the system simultaneously or at different times. For example, a cooling plant may first be added and commissioned so that the system has excess capacity (even beyond that provided by the "extra" plant), and then the additional load may be added when the new plant is proven and stable. Alternatively, the load and a corresponding plant may be brought up together so that there is only one major change made to the overall system for each additional unit of load and supply. In addition, extra utilities may be installed and commissioned where they are needed. (Box 508).

Certain size restrictions may also be taken into account in determining the correlation between cooling loads and cooling plants. For example, if each row of computer racks, cooling units, and space for workers requires 10 feet, and each cooling plant is about 20 feet wide, then each cooling plant may be sized to service two rows of cooling units.

At box 510, a decision is made to determine whether all of the planned plants and cooling units have been installed (e.g., is the facility complete). If they have, then the process ends (box 512) and if they have not, the iterative part of the process 500 repeats.

Figure 6A:
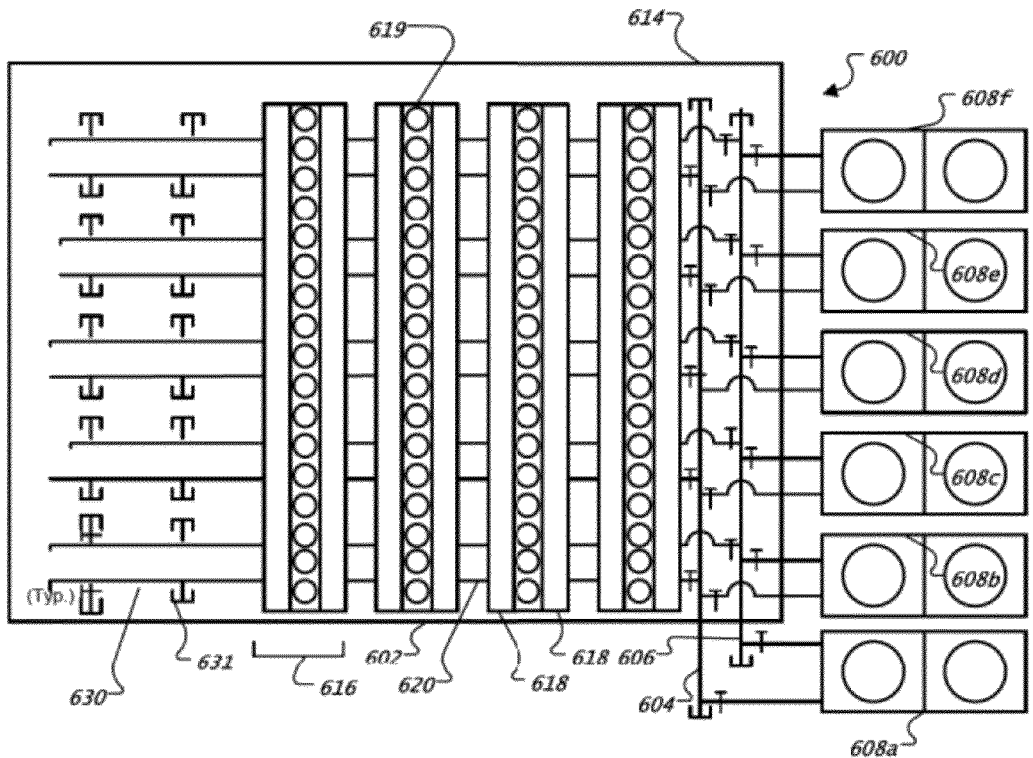
FIG. 6A is a plan view of a data center during construction, showing computers with cooling units and a cooling piping system.

FIG. 6A is a plan view of a data center 600 during construction, showing computers with cooling units and a cooling piping system. The data center 600 is generally made up of a computing facility 602 that may house thousands or tens of thousands of computing systems, and cooling plants 608*a-f* to provide cooling for those systems. In particular, groups of computers in the form of rows such as a row 616, have been installed inside facility 602.

In this example, four rows of computers 616 have been installed in the facility 602, where each row contains two rows of computing racks sandwiched on each side of corresponding cooling units 619. In one example, each rack may be approximately five feet wide (having three bays of computers per rack), six to eight feet or more high, and about 1.5 feet deep. In this example, the data center computers are installed as back-to-back rows of rack-mounted computers, where the computers back up to cooling units.

One utility that is provided to the facility 602 is in the form of cooling water, supplied by a cooling plants 608a-f. The cooling water may generally be circulated to cooling units located throughout the facility 602, such as water-to-air heat exchangers for cooling air in the facility 602 that has been heated by computing systems and computers in the facility at 602.

Cooling plants 608a-f are shown connected to supply header 604 and return header 606. A number of cooling loops 620, in the form of additional piping, have also been installed and connected to headers 604, 606 in preparation for installing computing racks above the loops 620. Although vertical positioning is not discernible in this figure, the cooling loop 620 may be located above, behind, below the level of the computer racks, as may cooling loops for the particular computing racks that are shown here, where those additional cooling loops are not visible in the figure. For example, the cooling loops may be located below a raised floor in a facility, or may be located in a ceiling space of a floor below a floor where the computing racks are located.

While the data center is in operation, circulating air may enter the fronts of the racks from the workspace, may pass across heated components in the racks, such as microprocessors and memory chips, and may be exhausted out of the back of the racks into the cooling units 619, so that each cooling unit receives heated exhaust air from racks on opposed sides. The cooling units 619 may be provided with air circulating equipment such as fans and cooling equipment such as cooling coils, so that air is drawn through the coils and exhausted in a cooled state back into the data center workspace. Cooled coolant fluid (generally water) is supplied to the cooling units 619 by cooling loops 620, and the warmed coolant fluid is taken away in cooling loops 620 and returned to cooling plants 608a-f for cooling.

In addition, various isolation valves, such as valve 614, are shown on headers 604, 606. The valves may be used to segment portions of the headers 604, 606 so that portions of facility 602 in which construction is still occurring may be kept dry and not in fluid communication with the rest of the system. Alternatively, valves such as shutoff valves or balancing valves that can also act as shut-off valves, so as to provide fluid-related segmentation of the system. Such valves may permit uncapping of the taps to connect additional components of the system, without providing fluid communication to the operational portions of the system. The valves 614 may also be used to permit one or more cooling plants to supply fluid to multiple cooling loops during initial construction of the computing facility 602, when not all computer units have been installed.

The cooling loops 620 also include isolation valves, such as valve 630, that allow unneeded portion of the cooling loop 620 to not be used until needed. The cooling loops 620 also include taps, such as tap 631, that allow for connection to a cooling unit once a cooling unit is ready for installation. The placement of isolation valves and taps in the cooling loops allow for construction of the computing facility in stages, and enable the computer servers to be built in rows in the computing facility as shown in FIG. 6A.

In the pictured example, each cooling plant 608b-f is associated with a particular cooling loop within facility 602. As shown, FIG. 6A illustrates one example of a data center using an interleaved cooling approach. Thus, the cooling loops 620 are generally placed in a perpendicular configuration compared to the rows of computing units 616 in the facility. In such a configuration, the cooling supplied by a particular loop may be provided to units in separate rows. As a result, if one loop needs to be taken off-line, the effect of such a change can be spread more easily across the facility, where other loops serving adjacent computers in various rows may pick up most of the slack.

Also, warmed air may circulate up and down each row behind the racks 618. As a result, if cooling units dispersed throughout a row are not currently receiving cooling water because an associated loop is down for servicing, the effect of that problem can be accommodated by adjoining units. Moreover, where the cooled air is discharged into the general workspace of the facility 602, any remaining un-cooled air will generally blend with the cooled air before it is re-circulated through the computer racks.

Other utilities may also be connected to the facility 602. Such utilities can include connections to the internet, connections to waste water systems (temporary or permanent), connections to power (temporary or permanent facilities), and other similar utilities needed to operate the data center 600.

Figure 6B:
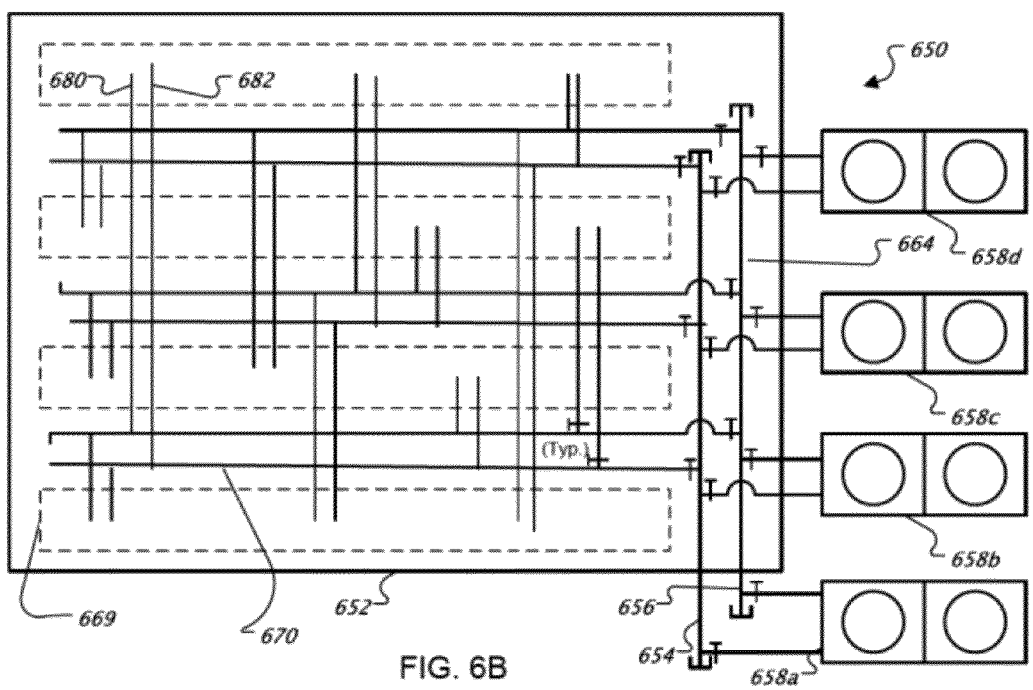
FIG. 6B is a plan view of a data center cooling piping system.

FIG. 6B is a plan view of a data center 650 cooling piping system. The data center 650 is similar to other data centers discussed above—generally made up of a computing facility 652 that may house thousands or tens of thousands of computing systems, and a number of cooling plants 658a-d connected to cooling loops 670 in the facility 652 via supply and return cooling fluid headers 654, 656. In this example, cooling loops 670 in the facility 652 run parallel with rows of computers 669 overhead (and shown in dashed lines here).

Take-offs 680, 682 from the loops 670, however, are run to multiple different rows of computers 669. (Where the take-offs are shown in the figure crossing part of a loop, the two are not connected in this example.) In particular, one loop may serve a row on one side of the loop and then a row on the other side of the loop. An adjacent cooling fluid loop may likewise serve cooling units in any of the rows that are between the loops. In this manner, adjacent cooling units in a row of computers may be served by different loops. Thus, if one loop is taken out of service, only some of the cooling units in a row will go down. Where air from adjacent units can be mixed and taken up by other units, the effect of taking down one loop can be spread out through the system and no row will need to be deactivated during the maintenance period. Also, where warm air and cool air is exhausted into the main workspace of facility 652 from adjacent units, the workspace may serve effectively as a thermal capacitor, so that the warm and cool air mix before being re-circulated through the computer racks and the ultimate rise in temperature of the mixed air will be negligible. Any rise in temperature may also be offset by increasing the flow of cooling fluid through the still-operating loops or decreasing its temperature slightly.

Such an arrangement may also work well where sequential commissioning of a data center is employed. In particular, crossing of cooling fluid taps from one row to another may be conducted in discrete subsets of rows, such as two rows or four rows. The sequential commissioning may then occur according to those sub-set units, such as where a pair of loops serving four rows is installed and the rows and loops are commissioned together (perhaps along with an appropriately-sized cooling plant).

Also, shut off valves may be provided on the taps to each cooling unit (not shown) so that single rows of units may be commissioned even where a loop serves multiple rows. For example, the bottom loop illustrated in FIG. 6B serves four different rows of racks. The loop may be installed initially and stubs having shut off valves may be installed at that time also. The stubs may be extended to the first row of racks (at the bottom in the figure), and the loop may be fluidically connected to the cooling system when the first row is commissioned. For example, only the left-most stub on the lowest loop in the figure may be fully built out initially, with the rest of the stubs left as short stubs.

Additional piping may be added as additional rows of racks are added, For example, When the second row of computer racks is installed, the taps for that row may be extended and connected, and the shut-off valves serving stubs to that row may be opened when that row is commissioned. In the pictured example, the third (top) loop serves the second row of computers form the bottom; in such a situation, the loop may not yet be installed when the second row of computers from the bottom is ready for commissioning. As a result, the particular cooling that was to be served by the top loop may remain unserved until the final loop is commissioned. Although such an arrangement may create a hot spot in the system, the warm air coming out of that unit will be readily blended with cool air coming from adjacent units that are being served by the first and second loops, via cold-air mixing, which may provide additional diversity in a system. Thus, in these various manners greater diversity may be provided to a cooling system, particularly on the water side, so that adequate cooling may be provided even when a significant portion of the system is inoperable.

Figure 7A:
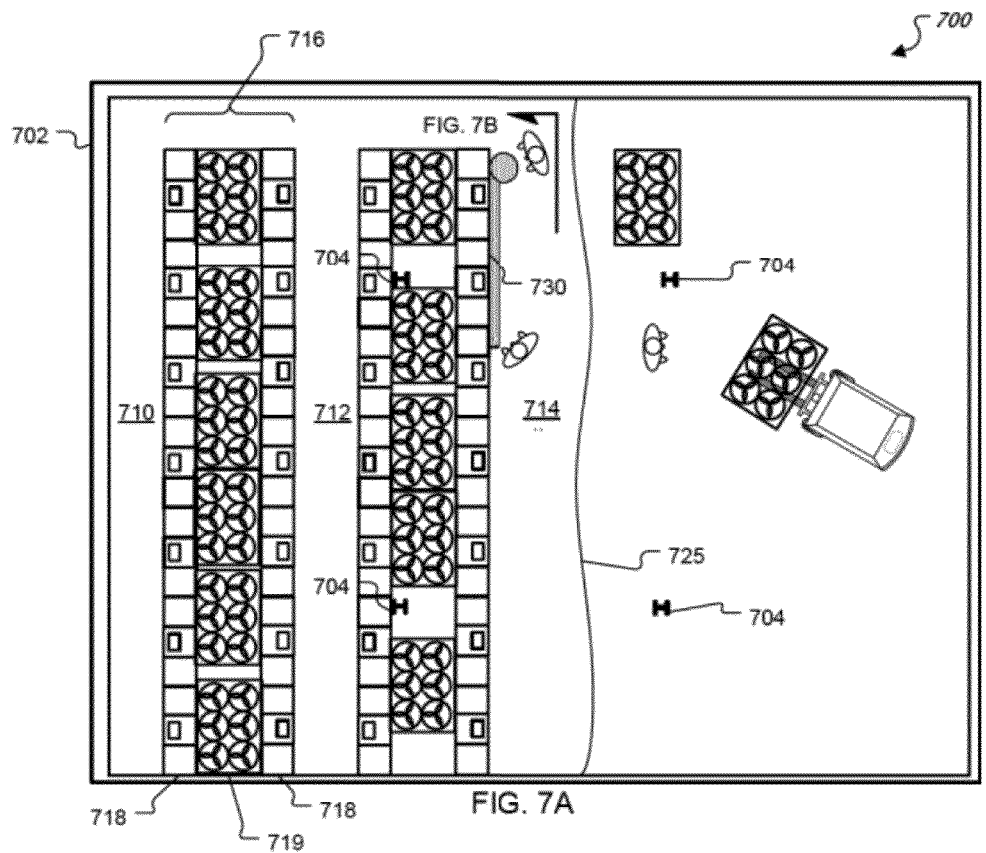
FIG. 7A is a plan view of a data center showing continued operation of computers while additional computers are installed.
Figure 7B:
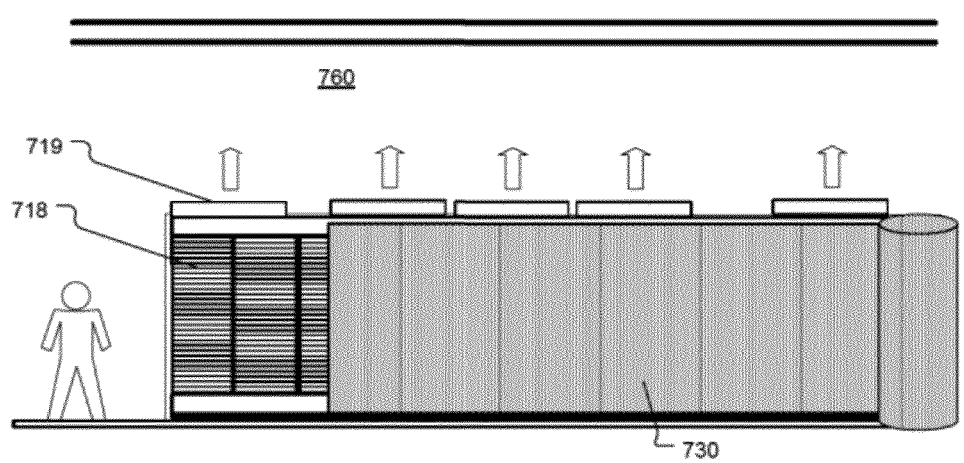
FIG. 7B is a section view of the data center in FIG. 7A.

FIG. 7A is a plan view of a data center showing continued operation of computers while additional computers are installed, while FIG. 7B is a section view of the data center in FIG. 7A. The data center 700 is generally made up of a computing facility 702 that may house thousands or tens of thousands of computing systems. The particular dimensions of the racks in relation to the size of the facility is exaggerated here for purposes of clarity In FIG. 7A, data center equipment has been placed in rows 719 and located in the data center 700 to fit efficiently with the given support column layout of the computing facility 702. In the figure, computing rows 716 have been spaced so as to fit around the support columns 704 shown in FIG. 7A. Computing rows 716 are composed of a row of cooling units 719 between the two rows of racks 718. The cooling units 719 are modular and approximately 5-10 feet in length so that they can be moved easily, e.g., with a forklift, and so that they can be spaced apart from each other so as to be positioned around the columns and thus make the columns effectively disappear in the data center.

Access rows 710, 712, 714 for accessing the computer racks have been positioned so as to fit between the computer rack rows 716 that include the support columns. The access rows 710, 712, 714 may be sized so as to permit technicians in a facility to service machines held in racks in the facility, and to install and remove the racks, such as when the racks are mounted in wheeled chassis.

As a result of locating the rows on the columns, rather than picking a set width for each item, certain access rows may be wider than are others. In addition, cooling modules in the row of cooling units 719 having support columns may also be unevenly spaced. Such a reduction in cooling modules may have no effect, if the computers that exhaust air into those rows are not generating more heat than even the reduced number of modules can absorb. Because warm air can move up and down a row, and thus mix between units, additional diversity may be created in the system. Even if there is some effect, the large area in the computing facility 702 helps serve as an absorber, or capacitor, to prevent substantial temperature variation or disturbances from having an appreciable effect on the operation of any computer rack in the facility 702.

The computers in rows such as row 716 are in operation but the facility 702 is still under construction, so an isolation curtain 725 divides the commissioned portion of the facility 702 from the portion still under construction. The isolation curtain 725 is installed to reduce environmental contamination or effects from the ongoing construction and installation of the facility from reaching the operating portions of the computing facility 702. The curtain may take the form of a flexible material such as plastic or tarpaulin sealed around the perimeter of the facility 702 and extended across an entire cross-section of the facility 702.

In certain implementations, temporary filtration may also be provided with the racks. For example, as portions of the computing facility 702 are operating while construction and installation proceeds in other areas of the computing facility, the rack rows 718 may be subject to dust, and other contaminants. Local filtration at the racks may therefore be beneficial in operating the computing facility 702, even when an isolation curtain 725 is already in place. Such filtration may result in a pressure drop, however, and thus may require additional power from the fans providing air circulation, resulting in higher electrical costs and perhaps in larger problems balancing pressure differences in the facility 702. Because such filtration may not be needed after construction and a sufficient break-in period are complete, temporary filtration may be beneficial.

FIG. 7B depicts the provision of such air filtration. To provide such air filtration, large relatively flat sheets or rolls of filtration material 730 may be installed and held against the fronts of the racks 718. For example, sheets of open-cell foam may be cut to approximate the height of the racks (or at least of the air intake areas on the racks) and may be pressed up against the racks to provide simple, low-cost filtration. Alternatively, rolls of foam material may be unrolled and placed against the fronts of the racks to act as a filtration material. Other filter media may be used in a similar manner.

Such filters may be held in place in a variety of manners. For example, differences in air pressure may be enough to provide some connection between the filters and the fronts of the racks, such as to hold the bottoms of the filters against the racks if the tops of the filters are connected. Greater strength of connection may be achieved with simple clamps, adhesives, or magnets attached to the filter media or a filter frame around the media, and other similar mechanisms. When construction is complete or a need for the filtration otherwise ceases, the filtration media may be removed and cleaned for re-use or discarded.

Figure 8:
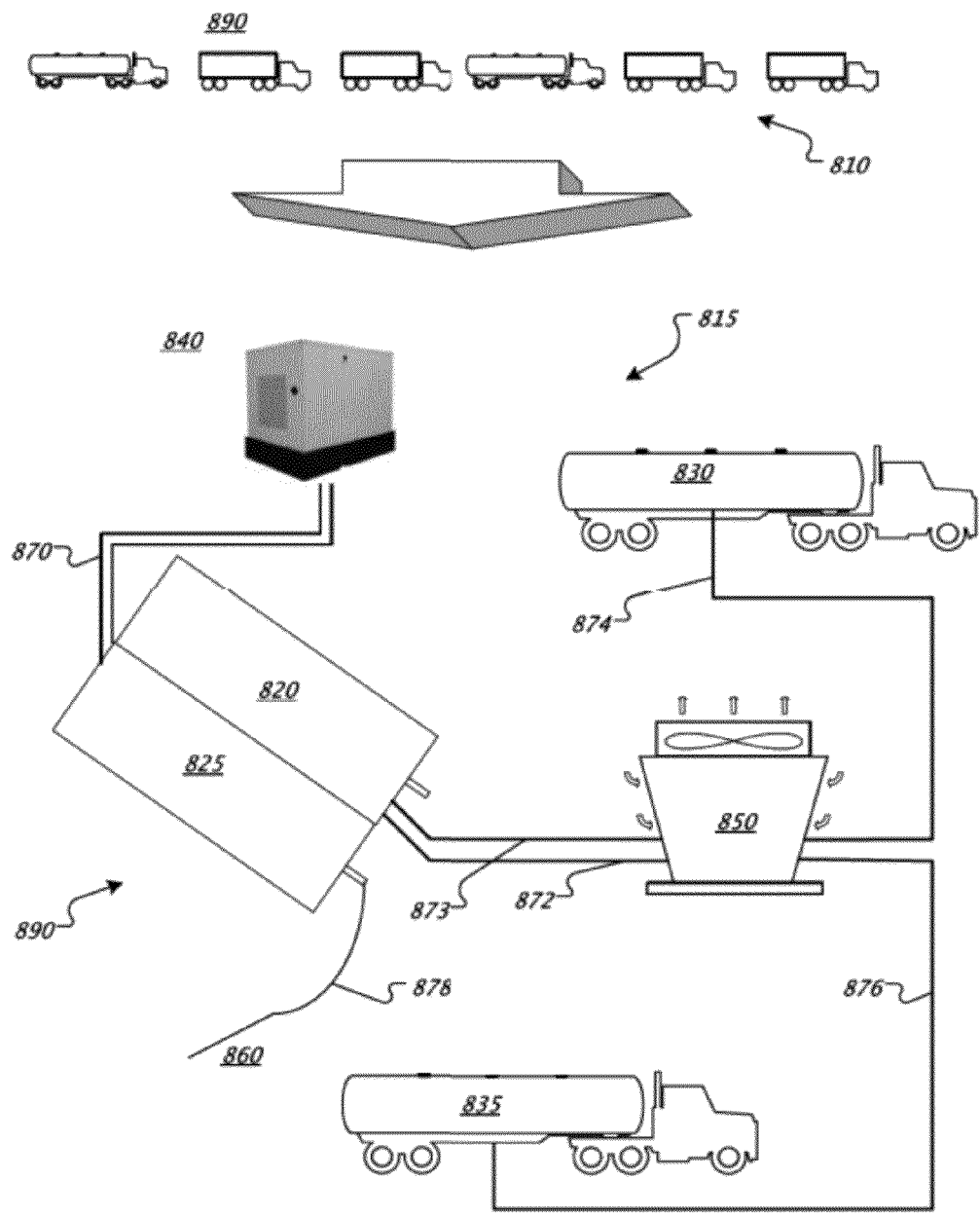
FIG. 8 is a conceptual diagram showing the use of portable utility services to serve a data center temporarily.

FIG. 8 is a conceptual diagram showing the use of portable utility services to serve a data center temporarily. Such an approach allows for the operation of a rapid deployment data center that can be in operation much more quickly than a data center that uses traditional, permanent components from the start.

The rapid deployment center includes a number of transportable modules. Because the modules may be transported, installed, operated, uninstalled, and transported again, they may be referred to as mobile modules. The modules may be transported by truck, rail, ship, air, or other method of transportation. The modules may be transported to a desired location and installed for use at that location. The modules may be used to create a temporary data center, to provide computing capacity while installation of a permanent data center proceeds, to augment an already-existing data center, to temporarily support an existing data center (such as during maintenance, emergencies, etc.), or for other uses. The modules may be of any type that would be used in a data center.

The mobile modules may be selected based on whatever needs of a data center are part of the critical path of a project plan to have the data center operations. Therefore, mobile or transportable modules may include data processing modules, power modules, cooling modules, water supply modules, waste water modules, data transmission modules, data center control modules, shelter modules (such as a tent, prefab building materials, etc.) and other types of modules that may be useful or needed. For example, where a facility has not yet received a water permit, make-up water for evaporation in cooling towers or for misting cooling towers may be provided.

A number of transportable modules may be used in a rapid deployment data center, as building blocks for such a center. In one example, a number of mobile modules may be identified and transported together as a mobile group 810 to create a rapid deployment data center. The modules may be located within shipping containers (where feasible) or may be in specific containers depending on the type of module. Packaging of a module in a shipping container may permit for more flexible and automated data center transportation and assembly.

The mobile group 810 may be transported and installed at a data center location 890. All of the needed modules may be transported to the data center location 890 from one or more origination points. The various components in the modules may be assembled efficiently at their points of origin, where applicable. Alternatively, some modules may be shipped from some distance, while others such as water trucks, may be obtained or leased more locally to the data center location. The data center location 890 may be prepared before or after the mobile group 810 arrives at the location 890.

The location 890 may be in a variety of states for establishing a data center location. For example, the data center location 890 may be a cleared and leveled area, a graveled area, an asphalt or concrete lot or pad, or may be another type of ground condition amenable to installation of the rapid deployment data center modules. The location may be one large location, or may be separated into a number of sub-locations (such as two separate parking lots, etc.) The data center location 890 may be open, may be within a warehouse or other building, may be located within a temporary building or shelter installed before or after arrival of the mobile group 810, or may be located within a tent installed before or after arrival of the mobile group 810.

FIG. 8 shows one example of a rapid deployment data center 815 installed and operational at data center location 890. Rapid deployment data center 815 includes two mobile data processing modules 820, 825 that have been transported and installed. The data processing modules include racks of servers, and are described in more detail in regards to FIGS. 9A and 9B.

The mobile data processing modules may be designed to operate independently of each other. Alternatively, the mobile data processing modules 820, 825 may be designed and constructed such that the sidewalls and/or end walls of the containers are removable and a connection to another data processing module may be made. This design feature allows for multiple data processing modules to be installed adjacent to each other to form a single connected data processing facility, and enables common access to all of the servers within the facility, even though they may be located in different modules. In addition to the removable sidewalls and/or end walls, the design may include elements to enable a good connection with adjacent data centers, such that a secure and contained physical environment may be created. Thus, the common facility feature further allows for common air circulation to create a more stable and common environment within the data processing modules. Furthermore, such a design may further allow for easier utility connections, as utilities in the modules can be connected together, and therefore may only require one external connection for each utility to the common facility, rather than multiple connections to multiple separate data processing modules. In other designs, some utilities may be connected together and supplied in one location to the common facility, while other utilities may continue to be supplied to each individual data processing module.

Rapid deployment data center 815 includes a number of other modules in support of the data processing modules 820, 825. A mobile power generation module 840 has been transported and installed at the site 890, and is connected to the data processing modules 820, 825 though cables 870. A mobile water cooling tower 850 has been installed at the site 890, and is connected to the data processing modules 820, 825 through piping 872 and 873. Cooled cooling fluid (typically water) is supplied from the cooling tower 850 through a supply pipe 872, where it is used to cool the air circulated through the data processing modules 820, 825. Warmed cooling fluid then returns to the cooling tower 850 through return piping 873, where the cooling fluid is cooled to be returned to the data processing modules.

The cooling fluid is cooled at the cooling tower by using one or more heat exchangers to exchange heat from the cooling fluid and water at the cooling tower 850. Accordingly, make-up water is supplied to the cooling tower 850 by water piping 874 from a water supply module 830 (shown as a tanker truck). Water is circulated, and evaporated in order to cool the water for exchanging heat with the cooling fluid in heat exchangers located within the cooling tower 850. In order to continue operating effectively, water must be drawn from the cooling tower. Over time, the circulated water typically includes elevated levels of sediments, chemicals, or other materials. Therefore, portions of the circulated water may be drawn to a waste water module 835 by waste water piping 876. Typically, a waste water module 835 will be used in areas where a sewer connection cannot be made, or where regulations so require disposal of sediment and other materials. Although a cooling tower 850 is shown as the cooling module, other options may also be used. For example, an air cooler, air conditioner, hybrid cooling tower, chillers, or other options may be used.

Rapid deployment data center 815 also includes a connection to the internet 860 over optical fibers 878 or other transmission hardware. In general, any appropriate type of connection may be made, including by using optical fiber, wiring, a wireless connection such as a cell connection or satellite, or other type of connection using any transmission equipment. Thus, the rapid deployment data center 815 may also include one or more transmission equipment modules, such as a cell tower, satellite linkage, or other equipment.

In some cases, the rapid deployment data center 815 may also include a control module (e.g., digital electronic control system 211), which may be used to monitor and control utilities, transmissions, and other necessary items at the location 890. In other cases, not all modules shown in FIG. 8 may be included in the rapid deployment data center. For example, if a location has connections to water supply and waste water treatment, the water supply and waste water modules would not be included in the rapid deployment data center at that location. As another example, if a location has access to power, but lacks other services, a rapid deployment data center at that location would not include a power generation module.

The rapid deployment data center 815 may be used in various manners. For example, it may serve as a temporary data center that is dismantled all at once after some time, such as when a permanent data center has been commissioned and is operational. In other cases, the rapid deployment data center 815 may serve as a foundation for constructing a permanent data center, and modules may be individually dismantled over time as permanent facilities are constructed or permanent connections made to replace the various modules. In other cases, a small mobile data center may provide services for some time, such as when the need for a permanent facility is not yet great enough to create a sufficient need for a permanent facility. Also, more permanent components may be used in some portions of the data center, such as for computer racks and associated cooling equipment inside a data center facility, while portable modules may be used outside the facility, such as to provide make-up water or remove sediment and other waste.

After use, the rapid deployment data center may be decommissioned and removed. As discussed, the decommissioning may occur over a period of time or may happen all at one time. Generally, the modules may be decommissioned and sent to a location for storage, sent to a location to be refurbished or repaired, shipped to a new location, returned to a leasing company, sold, or other disposition.

Figure 9A:
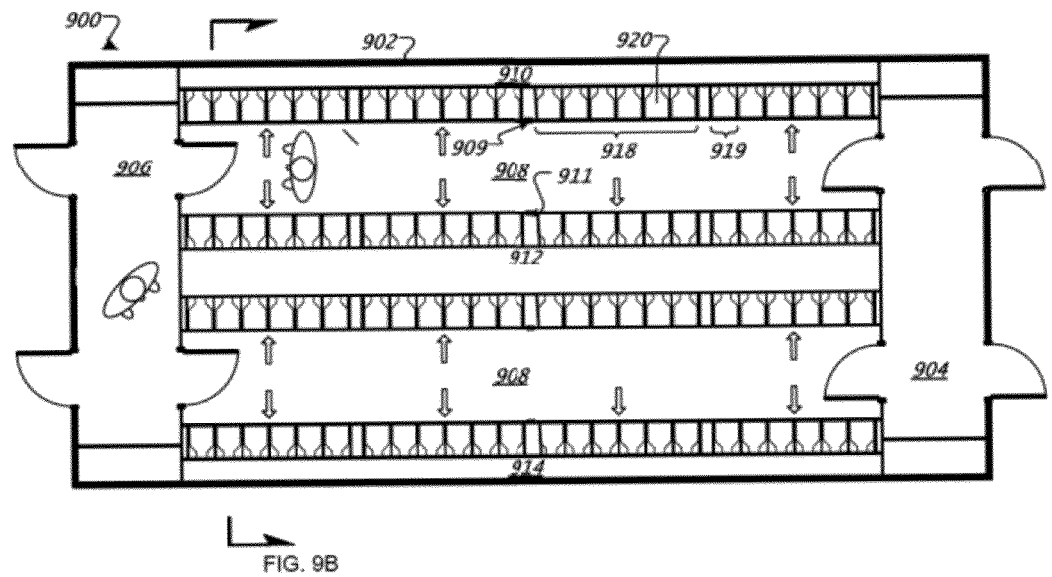
FIGS. 9A and 9B show plan and sectional views, respectively, of a modular data center system.
Figure 9B:
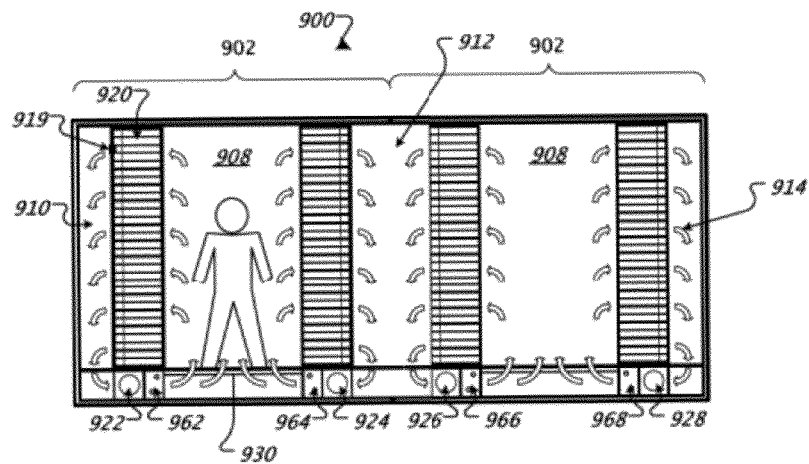

FIGS. 9A and 9B show plan and sectional views, respectively, of a modular data center system. The system may include one of more data processing centers 900 in shipping containers 902. Although not shown to scale in the figure, each shipping container 902 may be approximately 40 feet along, 8 feet wide, and 9.5 feet tall (e.g., a 1AAA shipping container). In other implementations, the shipping container can have different dimensions (e.g., the shipping container can be a 1CC shipping container). Such containers may be employed as part of a rapid deployment data center like that discussed with respect to FIG. 8.

Each container 902 includes side panels that are designed to be removed. Each container 902 also includes equipment designed to enable the container to be fully connected with an adjacent container. Such connections enable common access to the equipment in multiple attached containers, a common environment, and an enclosed environmental space.

Each container 902 may include vestibules 904, 906 at each end of the relevant container 902. When multiple containers are connected to each other, these vestibules provide access across the containers. One or more patch panels or other networking components to permit for the operation of data processing center 900 may also be located in vestibules 904, 906. In addition, vestibules 904, 906 may contain connections and controls for the shipping container. For example, cooling pipes (e.g., from heat exchangers that provide cooling water that has been cooled by water supplied from a source of cooling such as a cooling tower) may pass through the end walls of a container, and may be provided with shut-off valves in the vestibules 904, 906 to permit for simplified connection of the data center to, for example, cooling water piping. Also, switching equipment may be located in the vestibules 904, 906 to control equipment in the container 902. The vestibules 904, 906 may also include connections and controls for attaching multiple containers 902 together. As one example, the connections may enable a single external cooling water connection, while the internal cooling lines are attached together via connections accessible in vestibules 904, 906. Other utilities may be linkable in the same manner.

Central workspaces 908 may be defined down the middle of shipping containers 902 as aisles in which engineers, technicians, and other workers may move when maintaining and monitoring the data processing center 900. For example, workspaces 908 may provide room in which workers may remove trays from racks and replace them with new trays. In general, each workspace 908 is sized to permit for free movement by workers and to permit manipulation of the various components in data processing center 900, including providing space to slide trays out of their racks comfortably. When multiple containers 902 are joined, the workspaces 908 may generally be accessed from vestibules 904, 906.

A number of racks such as rack 919 may be arrayed on each side of a workspace 908. Each rack may hold several dozen trays, like tray 920, on which are mounted various computer components. The trays may simply be held into position on ledges in each rack, and may be stacked one over the other. Individual trays may be removed from a rack, or an entire rack may be moved into a workspace 908.

The racks may be arranged into a number of bays such as bay 918. In the figure, each bay includes six racks and may be approximately 8 feet wide. The container 902 includes four bays on each side of each workspace 908. Space may be provided between adjacent bays to provide access between the bays, and to provide space for mounting controls or other components associated with each bay. Various other arrangements for racks and bays may also be employed as appropriate.

Warm air plenums 910, 914 are located behind the racks and along the exterior walls of the shipping container 902. A larger joint warm air plenum 912 is formed where the two shipping containers are connected. The warm air plenums receive air that has been pulled over trays, such as tray 920, from workspace 908. The air movement may be created by fans located on the racks, in the floor, or in other locations. For example, if fans are located on the trays and each of the fans on the associated trays is controlled to exhaust air at one temperature, such as 40° C., 42.5° C., 45° C., 47.5° C., 50° C., 52.5° C., 55° C., or 57.5° C., the air in plenums 910, 912, 914 will generally be a single temperature or almost a single temperature. As a result, there may be little need for blending or mixing of air in warm air plenums 910, 912, 914. Alternatively, if fans in the floor are used, there will be a greater degree temperature variation from air flowing over the racks, and greater degree of mingling of air in the plenums 910, 912, 914 to help maintain a consistent temperature profile.

FIG. 9B shows a sectional view of the data center from FIG. 9A. This figure more clearly shows the relationship and airflow between workspaces 908 and warm air plenums 910, 912, 914. In particular, air is drawn across trays, such as tray 920, by fans at the back of the trays 919. Although individual fans associated with single trays or a small number of trays, other arrangements of fans may also be provided. For example, larger fans or blowers, may be provided to serve more than one tray, to serve a rack or group or racks, or may be installed in the floor, in the plenum space, or other location.

Air may be drawn out of warm air plenums 910, 912, 914 by fans 922, 924, 926, 928. Fans 922, 924, 926, 928 may take various forms. In one exemplary embodiment, the may be in the form of a number of squirrel cage fans. The fans may be located along the length of container 902, and below the racks, as shown in FIG. 9B. A number of fans may be associated with each fan motor, so that groups of fans may be swapped out if there is a failure of a motor or fan.

An elevated floor 930 may be provided at or near the bottom of the racks, on which workers in workspaces 908 may stand. The elevated floor 930 may be formed of a perforated material, of a grating, or of mesh material that permits air from fans 922, 924 to flow into workspaces 908. Various forms of industrial flooring and platform materials may be used to produce a suitable floor that has low pressure losses.

Fans 922, 924, 926, 928 may blow heated air from warm air plenums 910, 912, 914 through cooling coils 962, 964, 966, 968. The cooling coils may be sized using well known techniques, and may be standard coils in the form of air-to-water heat exchangers providing a low air pressure drop, such as a 0.5 inch pressure drop. Cooling water may be provided to the cooling coils at a temperature, for example, of 10, 15, or 20 degrees Celsius, and may be returned from cooling coils at a temperature of 20, 25, 30, 35, or 40 degrees Celsius. In other implementations, cooling water may be supplied at 15, 10, or 20 degrees Celsius, and may be returned at temperatures of about 25 degrees Celsius, 30 degrees Celsius, 35 degrees Celsius, 45 degrees Celsius, 50 degrees Celsius, or higher temperatures. The position of the fans 922, 924, 926, 928 and the coils 962, 964, 966, 968 may also be reversed, so as to give easier access to the fans for maintenance and replacement. In such an arrangement, the fans will draw air through the cooling coils.

The particular supply and return temperatures may be selected as a parameter or boundary condition for the system, or may be a variable that depends on other parameters of the system. Likewise, the supply or return temperature may be monitored and used as a control input for the system, or may be left to range freely as a dependent variable of other parameters in the system. For example, the temperature in workspaces 908 may be set, as may the temperature of air entering plenums 910, 912, 914. The flow rate of cooling water and/or the temperature of the cooling water may then vary based on the amount of cooling needed to maintain those set temperatures.

The particular positioning of components in shipping container 902 may be altered to meet particular needs. For example, the location of fans and cooling coils may be changed to provide for fewer changes in the direction of airflow or to grant easier access for maintenance, such as to clean or replace coils or fan motors. Appropriate techniques may also be used to lessen the noise created in workspace 908 by fans. For example, placing coils in front of the fans may help to deaden noise created by the fans. Also, selection of materials and the layout of components may be made to lessen pressure drop so as to permit for quieter operation of fans, including by permitting lower rotational speeds of the fans. The equipment may also be positioned to enable easy access to connect one container to another, and also to disconnect them later. Utilities and other services may also be positioned to enable easy access and connections between containers 902.

Airflow in warm air plenums 910, 912, 914 may be controlled via pressure sensors. For example, the fans may be controlled so that the pressure in warm air plenums is roughly equal to the pressure in workspaces 908. Taps for the pressure sensors may be placed in any appropriate location for approximating a pressure differential across the trays 920. For example, one tap may be placed in a central portion of plenum 912, while another may be placed on the workspace 908 side of a wall separating plenum 912 from workspace 908. For example the sensors may be operated in a conventional manner with a control system (e.g., digital electronic control system 211) to control the operation of fans 922, 924, 926, 928. One sensor may be provided in each plenum, and the fans for a plenum or a portion of a plenum may be ganged on a single control point.

For operations, the system may better isolate problems in one area from other components. For instance, if a particular rack has trays that are outputting very warm air, such action will not affect a pressure sensor in the plenum (even if the fans on the rack are running at high speed) because pressure differences quickly dissipate, and the air will be drawn out of the plenum with other cooler air. The air of varying temperature will ultimately be mixed adequately in the plenum, in a workspace, or in an area between the plenum and the workspace.

Figure 10:
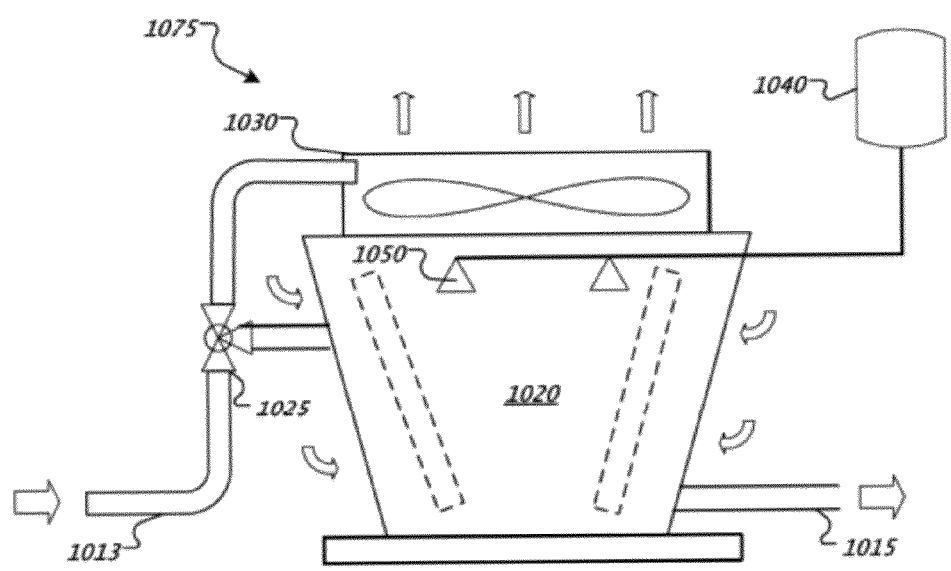
FIG. 10 shows a schematic diagram of a hybrid cooling tower for use with a data center.

FIG. 10 shows a schematic diagram of a hybrid cooling tower system 1075 for use with a data center (not shown). In general, the system 1075 can operate in two modes: a non-evaporative mode that provides limited cooling capacity but also requires very little or no make-up water, and an evaporative mode that provides much greater capacity but also uses much more make-up water.

The pictured system 1075 takes warm coolant that is supplied from a data center via piping 1013 to be cooled by the cooling tower 1020 and then supplied back to the facility via piping 1015. System 1075 may include various components needed to provide cooled water or other fluids to the computer racks in the data center. In some implementations, the system 1075 may be of a simplified design that includes an operating portion that contains many of the pumps and heat exchanging equipment for providing cooling water, and also a cooling tower 1020 portion that provides for circulation of air through an area where water may be flowing. In other implementations, the system 1075 and a broader cooling plant may be made up of modular units, such as a base unit that contains many of the pumps and heat exchanging equipment for providing cooling water, such as in a rectangular steel frame that is capable of being shipped on a standard train bed or truck bed (e.g., in the approximate dimensions of an inter-modal shipping container). One or more separate tower sections may later be placed on top of the base unit or base units.

The tower 1020 may generally receive water from the system 1075 by two alternative routes, as controlled by control valve 1025. Via a first route, which is used when the tower 1020 is operating in an non-evaporative mode, the cooling fluid may be routed through coils positioned in the tower 1020 that may have air drawn through them by a mechanical fan 1030, such as an updraft or downdraft fan. In such an arrangement, the fluid stays in a closed system, much like a car radiator system. Via a second route, the fluid may be expelled to atmosphere higher in the tower 1020 and made to cascade in the open over the outside of the coils. During such cascading, the water will be broken up so that it has more surface area exposed to the ambient air, and is more amenable to evaporation, and the great heat absorption that accompanies evaporation. When the water finally falls to the bottom of the tower 1020 where it can be picked up by piping 1015, it will be much cooler than its entering temperature.

Cooling in the non-evaporative mode can be supplemented in certain circumstances. For example, a tank of clean water 1040 (e.g., deionized or distilled water) may be installed near the cooling plant. When desired, the clean water may be supplied to sprayers 1050 located within the cooling plant, which can be used to assist in cooling the air to provide for additional heat load capacity by application and evaporation of the spraying water in the air flow and on piping, etc. Such spraying or misting may bring down the temperature of the coils through which the cooling fluid is circulating and may in turn increase the rate of heat flow out of the cooling fluid. Supplementation may also occur in either mode, such as by the operation of a chiller or similar mechanism. Also, both supplemental options may be used in conjunction with each other, and other additional cooling options.

In general operation, the cooling plant may provide sufficient cooling from the cooling tower/heat exchanger/cooling coil system, though a powered refrigeration system such as a chiller may be provided for peak loads, such as when the outdoor ambient dew point is very high and the cooling tower cannot provide sufficient cooling alone. Thus, as with the air cooling mode, chiller units, water spraying, or other options may also be used to assist in water cooling. Control parameters for the system may also be set so as to avoid most or any need for the use of chillers or other such items.

The hybrid towers provide for additional options in cooling the cooling fluid from a data center. For example, the air cooled, non-evaporative, mode may be used when the air temperature will be below a certain temperature for a sufficient period of time, while the water cooling, evaporative mode may be used for air temperatures above a certain point. As another example, air cooled mode may be used when the requirements for cooling are less, and water cooled mode used for greater cooling requirements. For example, if a portion of a data center load is down for maintenance, or if a portion is currently being installed, or for other reasons, the cooling required by the data center may be lessened and operating in air cooled mode may provide for sufficient cooling.

In operation, cooling plant 1010 may respond to signals from various sensors placed in the data facility. The sensors may include, for example, thermostats, humidistats, flowmeters, and other similar sensors. In one implementation, one or more thermostats may be provided in warm air capture plenums in the cooling modules, and one or more thermostats may be placed in workspace. The cooling plant may be operated in response to these and other signals.

In some implementations, multiple hybrid cooling plants may be provided for a data facility. The plants may be associated with a set number of server rows inside the facility, such as a single row or two rows. The particular plant may then serve that row or rows or servers for cooling. Additional diversity and redundancy may also be provided by connecting each of the cooling plants to a common header and each of the rows to a common header, so that every row can still access cooling water from the header even if one of the plants goes off line, or if less than full capacity of the cooling plants is needed.

The descriptions here are exemplary only, and are not intended to be limiting in any manner. In addition, the logic flows depicted in the figures do not necessarily require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A method of providing cooling by a cooling system to a computer data center, the method comprising:
    providing a first cooling water circuit arranged to circulate first cooling water between (a) equipment that cools air circulated inside the computer data center and (b) one or more water-to-water heat exchangers;
    providing a second cooling water circuit arranged to circulate second cooling water between (a) the one or more water-to-water heat exchangers and (b) a plurality of closed water-to-air heat exchangers that have powered fans for circulating atmospheric air across a plurality of coils;
    mechanically circulating water through the first cooling water circuit to draw heat from the data center and to provide the heat from the data center to the second cooling water circulated through the one or more water-to-water heat exchangers; and
    mechanically circulating water through the second cooling water circuit to draw heat from the second cooling water circulated through the one or more water-to-water heat exchangers to the atmospheric air circulated through the one or more water-to-air heat exchangers outside the data center,
    wherein water in the first cooling water circuit is isolated from water in the second cooling water circuit, and both cooling water circuits are closed so that water in both cooling water circuits is isolated from an ambient environment around the cooling system.

2. The method of claim 1, further comprising:
    controllably circulating (a) a first part of the water in the first cooling water circuit to a first side of one or more chillers to cool the first part of the water, and (b) a second part of the water in the first cooling water circuit to the one or more water-to-water heat exchangers to cool the second part of the water; and
    mixing the first part of the water cooled with the one or more chillers with the second part of the water cooled in the one or more water-to-water heat exchangers before returning the water to equipment in the data center that is cooled by the water.

3. The method of claim 2, further comprising blending water circulated to the first side of the one or more chillers with water circulated to the one or more water-to-water heat exchangers.

4. The method of claim 2, further comprising controllably proportioning relative amounts of water provided to the one or more chillers, and the water-to-water heat exchangers in response to heat load conditions sensed for the data center.

5. The method of claim 4, where the heat load conditions sensed for the data center comprise changes in ambient conditions near the data center, heat loads in the data center, or both.

6. The method of claim 4, further comprising performing the controllable proportioning using three-way mixing valves in the first cooling water circuit and the second cooling water circuit.

7. The method of claim 6, further comprising circulating the blended water to the equipment that cools air circulated inside the computer data center.

8. The method of claim 1, further comprising misting water on the water-to-air heat exchangers to increase heat transfer out of water circulated through the water-to-air heat exchangers.

9. The method of claim 1, wherein the fans comprise updraft or downdraft fans.

10. The method of claim 1, further comprising circulating water in the first cooling water circuit through a header that connects, and is located between, (a) cooling water sub-circuits for the data center and (b) the one or more water-to-water heat exchangers.

11. A cooling system for a computer data center, the system comprising:
    fluid conduits forming (1) a first cooling water circuit that is arranged to circulate first cooling water between (a) equipment that cools air circulated inside the computer data center and (b) one or more water-to-water heat exchangers, and (2) a second cooling water circuit that is arranged to circulate second cooling water between (a) the one or more water-to-water heat exchangers and (b) a plurality of closed water-to-air heat exchangers that have powered fans for circulating atmospheric air across a plurality of coils;

one or more first pumps connected to circulate water through the first cooling water circuit to draw heat from the data center and to provide the heat from the data center to the one or more water-to-water heat exchangers; and one or more second pumps connected to circulate water through the second cooling water circuit to draw heat from the one or more water-to-water heat exchangers to the one or more water-to-air heat exchangers outside the data center, wherein water in the first cooling water circuit is isolated from water in the second cooling water circuit, and both cooling water circuits are closed to atmosphere so that water in both cooling water circuits is isolated from an ambient environment around the cooling system.

12. The system of claim 11, further comprising a central control system programmed to control the first pumps in response to changes in cooling load on the data center, changes in atmospheric heat conditions, or both.

13. The system of claim 12, further comprising a plurality of control valves connected to the central control system and arranged to controllably alter a proportion of flow in the first cooling water circuit that is routed in the first cooling water circuit to chilled water sides of one or more chillers, as compared to water that is routed through a first side of the one or more water-to-water heat exchangers.

14. The system of claim 13, wherein the central control system is programmed to increase a proportion of water that is provided to the chilled water sides of the one or more chillers relative to a proportion of water that is provided to the first side of the one or more water-to-water heat exchangers, when a cooling load in the data center increases, ambient heat conditions increase, or both.

15. The system of claim 11, further comprising a data center supply header and a data center return header in the first cooling water circuit, the data center supply header and the data center return header including conduits having a plurality of taps, with a first plurality of taps connected to piping that is inside the data center, and a second plurality of taps connected to outputs of the one or more chillers.

16. The system of claim 15, wherein the data center supply header and data center return header are arranged to intermix chilled water supplied from the one or more chillers with water supplied from the one or more water-to-water heat exchangers, so as to provide increased cooling diversity in the first cooling fluid circuit.

17. The system of claim 15, further comprising a condenser loop supply header and condenser loop return header that each include a conduit having a plurality of taps, with a first plurality of taps connected to the water-to-air-radiators and a second plurality of taps connected to the one or more chillers and the one or more water-to-water heat exchangers.

18. A cooling system for a computer data center, comprising:

a plurality of closed water-to-air heat exchangers connected to a condenser water loop that is closed to an environment around the heat exchangers;

one or more water-to-water heat exchangers each having a first side connected to the condenser water loop, and a second side connected to a cooling water loop that is further connected to cooling equipment that is arranged to cool a data center; and a control system, pumps, and valving arranged in coordination with each other to controllably increase or decrease an amount of water circulated through the closed water-to-air heat exchangers in response to changing heat conditions in or around the data center, wherein the closed water-to-air heat exchangers are closed to an environment that surrounds the water-to-air heat exchangers.

19. The system of claim 18, further comprising one or more chillers having first sides connected to the cooling water loop and second sides connected to the condenser water loop.

20. The system of claim 19, wherein the control system is programmed to increase utilization of the one or more chillers relative to utilization of the plurality of closed water-to-air heat exchangers in response to increasing heat conditions in or around the data center.

21. The system of claim 19, wherein at least a portion of the control system, pumps, and valving arranged in coordination with each other are arranged to intermix chilled water supplied from the one or more chillers with cooled water supplied from the one or more water-to-water heat exchangers, so as to provide increased cooling diversity in the first cooling fluid circuit.

22. The method of claim 1, further comprising transferring the heat from the data center directly to the second cooling water from the first cooling water in the one or more water-to-water heat exchangers.

\* \* \* \* \*